(12) United States Patent
Yanagisawa et al.

(10) Patent No.: US 8,218,095 B2
(45) Date of Patent: Jul. 10, 2012

(54) PROJECTOR

(75) Inventors: Yoshiyuki Yanagisawa, Matsumoto (JP); Yasunaga Momose, Tatsuno-machi (JP)

(73) Assignee: Seiko Epson Corporation, Tokyo (JP)

(*) Notice: Subject to any disclaimer, the term of this patent is extended or adjusted under 35 U.S.C. 154(b) by 233 days.

(21) Appl. No.: 12/752,454

(22) Filed: Apr. 1, 2010

(65) Prior Publication Data

US 2010/0253865 A1 Oct. 7, 2010

(30) Foreign Application Priority Data

Apr. 3, 2009 (JP) ................................. 2009-090844
Feb. 23, 2010 (JP) ................................. 2010-037389

(51) Int. Cl.
*G02F 1/1335* (2006.01)
(52) U.S. Cl. .......................................................... 349/5
(58) Field of Classification Search ........................ 349/5
See application file for complete search history.

(56) References Cited

U.S. PATENT DOCUMENTS 7,150,543 B2 * 12/2006 Fujimori et al. .............. 362/373

FOREIGN PATENT DOCUMENTS

| JP | 2004-117580 A | 4/2004 |
| JP | 2005-275296 A | 10/2005 |
| JP | 2007-041412 A | 2/2007 |
| JP | 2007-041413 A | 2/2007 |

* cited by examiner

*Primary Examiner* — Uyen Chau N Le
*Assistant Examiner* — Chris Chu
(74) *Attorney, Agent, or Firm* — AdvantEdge Law Group, LLC

(57) ABSTRACT

A projector includes: a liquid crystal panel having liquid crystal encapsulated between a pair of substrates; a liquid-cooling device adapted to cool the liquid crystal panel with a cooling liquid; and a first translucent substrate made of an optical crystal material having thermal conductivity in a direction parallel to an optical axis higher than thermal conductivity in a direction orthogonal to the optical axis disposed on an outer surface of one of the pair of substrates, wherein the liquid-cooling device includes a liquid circulation pipe having a pipe shape through the cooling liquid, and disposed along at least one of side end sections in the first translucent substrate, and the liquid circulation pipe is coupled to the first translucent substrate in a manner of enabling heat transfer so that a flow direction of at least a part of the cooling liquid is orthogonal to the optical axis.

8 Claims, 15 Drawing Sheets

PROJECTOR

BACKGROUND

1. Technical Field

The present invention relates to a projector.

2. Related Art

In the past, there has been proposed a configuration of a projector in which a cooling liquid is made to flow into and out from a holding member for holding an liquid crystal panel in order for efficiently cooling the liquid crystal panel, thereby cooling the liquid crystal panel with the cooling liquid (see, e.g., JP-A-2007-41412 (Document 1)).

Specifically, the holding member is provided with a liquid circulation pipe having a circular shape surrounding a light transmission area of the liquid crystal panel, and making the cooling liquid flow inside, and a support frame having the liquid circulation pipe disposed inside and for supporting a peripheral portion of the liquid crystal panel in a manner of enabling heat transfer.

Further, in the projector described in the Document 1, a dust-proof glass is bonded to the outer surface of each of the liquid crystal panels in order for preventing dust from being reflected into the projection image even in the case in which the dust is attached to the outer surface.

Further, the liquid circulation pipe described above is coupled to the surface of the dust-proof glass via the support frame in the state of allowing heat transfer.

Incidentally, in the projector described in the Document 1, there is adopted a quartz crystal, which is an optical crystal having the thermal conductivity different between a direction parallel to the optical axis and a direction orthogonal thereto, as the dust-proof glass.

Further, in the case of adopting such a dust-proof glass, there arises a problem that it is difficult to preferably transmit the heat in the central portion of the liquid crystal panel to the liquid circulation pipe disposed on the periphery of the liquid crystal panel via the dust-proof glass due to the thermal conductivity anisotropy of the dust-proof glass described above, and therefore, the in-plane temperature difference of the liquid crystal panel between the central portion and the peripheral portion becomes large.

SUMMARY

An advantage of some aspects of the invention is to provide a projector capable of reducing the in-plane temperature difference of the liquid crystal panel, and efficiently cooling the liquid crystal panel.

According to an aspect of the invention, there is provided a projector including a liquid crystal panel having liquid crystal encapsulated between a pair of substrates, a liquid-cooling device adapted to cool the liquid crystal panel with a cooling liquid, and a first translucent substrate made of an optical crystal material having thermal conductivity in a direction parallel to an optical axis higher than thermal conductivity in a direction orthogonal to the optical axis disposed on an outer surface of one of the pair of substrates, wherein the liquid-cooling device includes a liquid circulation pipe having a pipe shape through the cooling liquid, and disposed along at least one of side end sections in the first translucent substrate, and the liquid circulation pipe is coupled to the first translucent substrate in a manner of enabling heat transfer so that a flow direction of at least apart of the cooling liquid is orthogonal to the optical axis.

Here, it is sufficient for the liquid circulation pipe to have a configuration of being disposed along at least one of the side end sections in the first translucent substrate. Specifically, in the case in which the first translucent substrate has a rectangular planar shape, for example, there can be cited as examples of the liquid circulation pipe, a configuration of being disposed along one of the four side end sections, a configuration of being disposed along two of the four side end sections so as to have a planar L shape, and a configuration of being disposed along three of the four side end sections so as to have a planar U shape.

In this aspect of the invention, the first translucent substrate is made of the optical crystal material such as quartz crystal described above. Further, the liquid circulation pipe is coupled to the first translucent substrate in a manner of enabling heat transfer so that the flow direction of at least a part of the cooling liquid is orthogonal to the optical axis. According to this configuration, it is possible to transfer the heat generated in the central portion of the liquid crystal panel to the liquid circulation pipe (the cooling liquid flowing therethrough) along a direction parallel to the optical axis along which the first translucent substrate has relatively high thermal conductivity to thereby perform heat radiation efficiently.

Therefore, it is possible to reduce the in-plane temperature difference between the central portion and the peripheral portion of the liquid crystal panel to thereby efficiently cool the liquid crystal panel.

According to another aspect of the invention, in the projector of the above aspect of the invention, it is preferable that the first translucent substrate has a rectangular planar shape, and the liquid circulation pipe is curved so as to be disposed along three out of the four side end sections in the first translucent substrate.

It should be noted that for the sake of convenience of explanation, among the three side end sections of the first translucent substrate, each of the side end sections opposed to each other is hereinafter described as an opposed side end section, and either one of the side end sections located adjacent to each of the opposed side end sections is hereinafter described as an adjacent side end section.

Further, in the liquid circulation pipe formed to be curved as described above, the portion disposed along each of the opposed side end sections of the first translucent substrate is described as an opposed portion, and a portion disposed along the adjacent side end section is described as an adjacent portion.

In this aspect of the invention, the liquid circulation pipe is formed to be curved so as to be disposed along each of the opposed side end sections and the adjacent side end section in the first translucent substrate having a rectangular planar shape. According to this configuration, by coupling each of the opposed portions and the adjacent portion of the liquid circulation pipe respectively to each of the opposed side end sections and the adjacent side end section in a manner of enabling heat transfer, it is possible to transfer the heat generated in the central portion of the liquid crystal panel to each of the opposed portions and the adjacent portion of the liquid circulation pipe via the first translucent substrate, and to further reduce the in-plane temperature difference between the central portion and the peripheral portion of the liquid crystal panel.

According to still another aspect of the invention, in the projector of the above aspect of the invention, it is preferable that denoting a dimension obtained by adding length dimensions of opposed side end sections opposed to each other out of the three side end sections as A, and a length dimension of an adjacent side end section located adjacent to the opposed side end sections as B, the first translucent substrate has the optical axis orthogonal to each of the opposed side end sections if a relationship of A>B is satisfied, and the first translucent substrate has the optical axis orthogonal to the adjacent side end section if a relationship of A<B is satisfied.

Incidentally, if the relationship of A>B is satisfied, in the liquid circulation pipe, the liquid volume (hereinafter referred to as an opposed side liquid volume) obtained by adding the liquid volumes of the cooling liquid inside the respective opposed portions becomes larger than the liquid volume (hereinafter referred to as an adjacent side liquid volume) of the cooling liquid inside the adjacent portion.

In this aspect of the invention, the first translucent substrate is formed so that the optical axis is orthogonal to each of the opposed side end sections, namely the optical axis faces to each of the opposed side end sections, if the relationship of A>B is satisfied.

According to this configuration, it is possible to transfer the heat generated in the central portion of the liquid crystal panel mainly to each of the opposed portions with a large liquid volume along the optical axis of the first translucent substrate to thereby perform heat radiation efficiently. Therefore, it is possible to effectively cool the central portion of the liquid crystal panel to thereby further reduce the in-plane temperature difference between the central portion and the peripheral portion of the liquid crystal panel.

In contrast, if the relationship of A<B is satisfied, inversely to the above, the adjacent side liquid volume becomes larger than the opposed side liquid volume.

In this aspect of the invention, the first translucent substrate is formed so that the optical axis is orthogonal to the adjacent side end section, namely the optical axis faces to the adjacent side end section, if the relationship of A<B is satisfied.

According to this configuration, it is possible to transfer the heat generated in the central portion of the liquid crystal panel mainly to the adjacent portion with a large liquid volume along the optical axis of the first translucent substrate to thereby perform heat radiation efficiently. Therefore, similarly to the above, it is possible to effectively cool the central portion of the liquid crystal panel to thereby further reduce the in-plane temperature difference of the liquid crystal panel.

According to yet another aspect of the invention, in the projector of the above aspect of the invention, it is preferable that the first translucent substrate has the optical axis aligned with a longitudinal direction.

Incidentally, the longer the distance from the central portion to the side end section of the first translucent substrate is, the larger the thermal resistance between the central portion of the first translucent substrate and the liquid circulation pipe becomes in accordance with the distance. Therefore, regarding the short side direction of the first translucent substrate, since the distance from the central portion to the side end section is short, the heat can preferably be transferred to the liquid circulation pipe. However, regarding the longitudinal direction of the first translucent substrate, since the distance from the central portion to the side end section is long, it is difficult to transfer the heat preferably to the liquid circulation pipe.

In this aspect of the invention, since the first translucent substrate is formed so that the optical axis, along which the first translucent substrate has relatively large thermal conductivity, is aligned with the longitudinal direction, the thermal resistance in the longitudinal direction in the first translucent substrate can be reduced. Therefore, it is possible to preferably transfer the heat generated in the central portion of the liquid crystal panel to the liquid circulation pipe along the short side direction and the longitudinal direction in the first translucent substrate to thereby efficiently perform the heat radiation. Therefore, it is possible to effectively cool the central portion of the liquid crystal panel to thereby further reduce the in-plane temperature difference between the central portion and the peripheral portion of the liquid crystal panel.

According to still yet another aspect of the invention, in the projector of the above aspect of the invention, it is preferable that there is further provided a second translucent substrate made of an optical crystal material having thermal conductivity in a direction parallel to an optical axis higher than thermal conductivity in a direction orthogonal to the optical axis disposed on an outer surface of the other of the pair of substrates, the second translucent substrate has a rectangular planar shape, and the optical axis of the second translucent substrate is set to be parallel to a longitudinal direction of the second translucent substrate.

Here, since the intensity of the light input to the liquid crystal panel and the second translucent substrate is stronger in the center than in the periphery, the temperature of the second translucent substrate is apt to be higher in the center than in the periphery. In contrast, a direction along the optical axis is the direction along which the second translucent substrate has higher thermal conductivity. Therefore, by setting the optical axis to be parallel to the longitudinal direction, the area for holding the heat of the central portion apt to be heated to a high temperature in the second translucent substrate can be enlarged compared to the case in which the optical axis is set to be parallel to the short side direction, and therefore, the heat can be diffused in the plane.

Therefore, the in-plane temperature difference (the temperature difference inside the plane orthogonal to the optical axis of the light beam transmitted therethrough) of the second translucent substrate can be reduced, and therefore, the in-plane temperature difference of the liquid crystal panel to which the second translucent substrate is provided can also be reduced. Further, according to this advantage, in addition to achieving the longer life of the liquid crystal panel, it is possible to prevent the deterioration (e.g., a brightness variation and a color variation) in images due to a partial variation of the VT (applied voltage-light transmission) characteristic corresponding to the in-plane temperature difference.

According to further another aspect of the invention, in the projector of the above aspect of the invention, it is preferable that there is further provided a cooling device adapted to feed cooling air to the liquid crystal panel to cool the liquid crystal panel with the cooling air, and a flow direction of the cooling air fed by the cooling device and flowing along the second translucent substrate is set to be a direction orthogonal to an optical axis of the second translucent substrate.

Here, in the case in which the optical axis is parallel to the longitudinal of the second translucent substrate, and the flow direction of the cooling air is parallel to the optical axis, the channel of the cooling air flowing along the second translucent substrate becomes longer, and therefore, the temperature difference between a flow direction base end side (a windward side) and a flow direction front side (a leeward side) becomes larger.

In contrast, in the case in which the optical axis is parallel to the longitudinal of the second translucent substrate, and the flow direction of the cooling air is orthogonal to the optical axis, the channel of the cooling air flowing along the second translucent substrate becomes shorter compared to the case described above, and therefore, the temperature becomes substantially the same between the pair of side end sections disposed along the short side, and further, the temperature difference between the pair of side end sections parallel to the longitudinal can be reduced.

Therefore, the in-plane temperature difference of the second translucent substrate can further be made smaller.

According to still further another aspect of the invention, in the projector of the above aspect of the invention, it is preferable that the second translucent substrate has a pair of side end sections disposed along a longitudinal and a pair of side end sections disposed along a short side, and the cooling device makes the cooling air flow toward one of the pair of side end sections disposed along the longitudinal in the second translucent substrate on a side where the liquid circulation pipe is located from the other of the pair of side end sections on the side where the liquid circulation pipe is not located.

According to this aspect of the invention, the temperature of the flow direction base end side (the windward side) of the cooling air in the second translucent substrate can be made lower than the temperature of the flow direction front side (the leeward side) thereof. Here, since the flow direction front side is provided with the liquid circulation pipe coupled to the first translucent substrate in a manner of enabling heat transfer, in the first translucent substrate, the temperature of the flow direction front side of the cooling air becomes lower than the temperature of the flow direction base end side thereof. Therefore, in the first translucent substrate disposed on the outer surface of one of the substrates of the liquid crystal panel, the region showing the highest temperature becomes the flow direction base end side of the cooling air, and in the second translucent substrate disposed on the outer surface of the other of the substrates, the region showing the highest temperature becomes the flow direction front side of the cooling air. Thus, since it is possible to efficiently cool the flow direction front side and the base end side in the liquid crystal panel, the in-plane temperature difference of the liquid crystal panel can further be reduced.

According to a further aspect of the invention, in the projector of the above aspect of the invention, it is preferable that the cooling device makes the cooling air flow in a manner in which the flow rate value of the cooling air at a position in the side end section along the longitudinal in the second translucent substrate is reduced as the position is shifted from a center of the side end section toward the side end section along the short side.

As described above, the temperature of the second translucent substrate is apt to become lower in the periphery. Therefore, by making the flow rate value of the cooling air flowing through the end portion of the second translucent substrate smaller than the flow rate value of the cooling air flowing through the central portion thereof, the in-plane temperature difference of the second translucent substrate can further be reduced. Further, since the flow rate value of the cooling air in the central portion becomes large, it is possible to efficiently cool the central portion of the second translucent substrate using the cooling air at a constant flow rate.

According to a still further aspect of the invention, in the projector of the above aspect of the invention, it is preferable that the cooling device feeds the cooling air so that the flow rate value of the cooling air at the position and a distance value from the center of the side end section along the longitudinal to the position have a linear relationship.

In this aspect of the invention, the flow rate value of the cooling air at a position in the side end section (in other words, the side end section disposed along the direction in which the higher thermal conductivity is provided) disposed along the optical axis is reduced as the position is shifted toward the end of the side end section so as to have a linear relationship (a proportional relationship) with a distance of the position from the center of the side end section. According to this aspect of the invention, the in-plane temperature difference of the second translucent substrate can further be made smaller.

According to a yet further aspect of the invention, in the projector of the above aspect of the invention, it is preferable that the liquid-cooling device has an optical element support frame adapted to support the liquid crystal panel, and to couple the first translucent substrate and the liquid circulation pipe to each other in a manner of enabling heat transfer, the optical element support frame has a first support frame and a second support frame provided separately from each other around a plane substantially parallel to the flow direction of the cooling liquid in the liquid circulation pipe, and adapted to sandwich the liquid circulation pipe, the first and second support frames and the liquid circulation pipe are each made of a metal material and are bonded to each other by soldering, and a material for the soldering is made of a material having a melting point equal to or lower than 200° C.

Incidentally, when integrating each of the support frames and the liquid circulation pipe made of a metallic material, it is possible to adopt an adhesive, for example.

However, in the case of using the adhesive, since the thermal conductivity of the adhesive is rather low, the thermal resistance between the support frame and the liquid circulation pipe becomes large, and therefore, it is difficult to preferably transfer the heat generated in the liquid crystal panel to the liquid circulation pipe (the cooling liquid).

Therefore, it is possible to bond each of the support frames and the liquid circulation pipe to each other by soldering. Here, the melting point of a general soldering material (lead-free solder) exceeds 200° C. However, in the case of using such a soldering material, since it is required to heat the soldering material up to the temperature exceeding 200° C. to melt the soldering material when bonding each of the support frames and the liquid circulation pipe, when each of the support frames and the liquid circulation pipe are cooled to be the room temperature after bonding each of the support frames and the liquid circulation pipe, residual stress is caused in each of the support frames and the liquid circulation pipe.

In other words, in the case in which the liquid crystal panel is supported by the support frames bonded as described above, each of the support frames applies force to the liquid crystal panel due to the influence of the residual stress, which might cause degradation in the image quality of the projection image.

In this aspect of the invention, the soldering material is made of a material with the melting point of 200° C. or lower. According to the configuration described above, the temperature when bonding each of the support frames and the liquid circulation pipe to each other can be set to be equal to or lower than 200° C., thus the residual stress caused in each of the support frames and the liquid circulation pipe after bonding can be reduced. Therefore, even in the case in which the liquid crystal panel is made to be supported by the support frames bonded to each other as described above, since the residual stress is thus reduced, deformation of the liquid crystal panel due to the support frames can be prevented, thus the image quality of the projection image can be maintained in a preferable state.

BRIEF DESCRIPTION OF THE DRAWINGS

The invention will be described with reference to the accompanying drawings, wherein like numbers reference like elements.

DESCRIPTION OF AN EXEMPLARY EMBODIMENT

Figure 1:
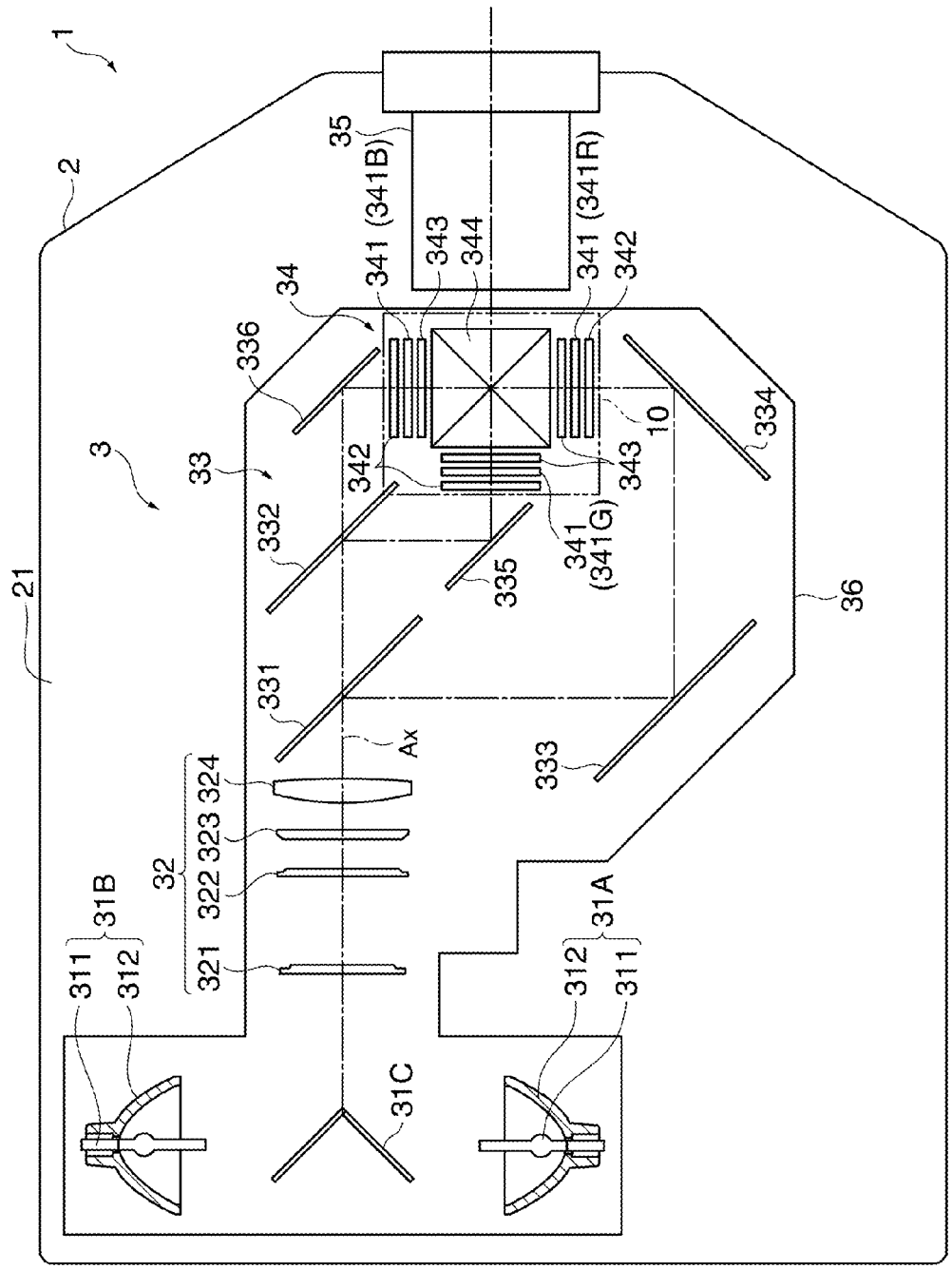
FIG. 1 is a diagram showing a schematic configuration of a projector according to an embodiment of the invention.

An embodiment of the invention will hereinafter be explained with reference to the accompanying drawings.
Configuration of Projector FIG. 1 is a diagram showing a schematic configuration of the projector 1 in the present embodiment.

The projector 1 forms an image corresponding to image information and then projects it on a screen (not shown), thereby displaying a projection image. As shown in FIG. 1, the projector 1 has a configuration of housing an optical unit 3, a liquid-cooling device 4 (see FIG. 2), and a cooling device 10 inside an exterior housing 2.

Among these components, the cooling device 10 is composed of a fan and a duct located above an optical device 34 constituting the optical unit 3. The cooling device 10 feeds the cooling air, which is taken from the outside of the exterior housing 2, toward the optical device 34 to thereby cool the optical device 34.
Configuration of Optical Unit The optical unit 3 forms an image in accordance with image information, and then projects the image under control of a control device (not shown).

As shown in FIG. 1, the optical unit 3 is provided with a pair of light source devices 31A, 31B, a reflecting mirror 31C, an illumination optical device 32 including lens arrays 321, 323, a polarization conversion element 323, and an overlapping lens 324, a color separation optical device 33 including dichroic mirrors 331, 332 and reflecting mirrors 333 through 336, an optical device 34 including three liquid crystal panels 341 (the liquid crystal panel on the red light side is denoted as 341R, the liquid crystal panel on the green light side is denoted as 341G, and the liquid crystal panel on the blue light side is denoted as 341B), three entrance side polarization plates 342, and three exit side polarization plates 343 as light modulation devices, and a cross dichroic prism 344 as a color combining optical device, the projection lens 35 as a projection optical device, and an optical component housing 36 for housing these members 31A, 31B, 31C, and 32 through 34 described above in the inside thereof.

Here, as shown in FIG. 1, the pair of light source devices 31A, 31B have substantially the same configurations each provided with a light source lamp 311 and a reflector 312. Further, the pair of light source devices 31A, 31B are disposed across the reflecting mirror 31C from each other so as to emit respective light beams toward the reflecting mirror 31C.

Figure 2:
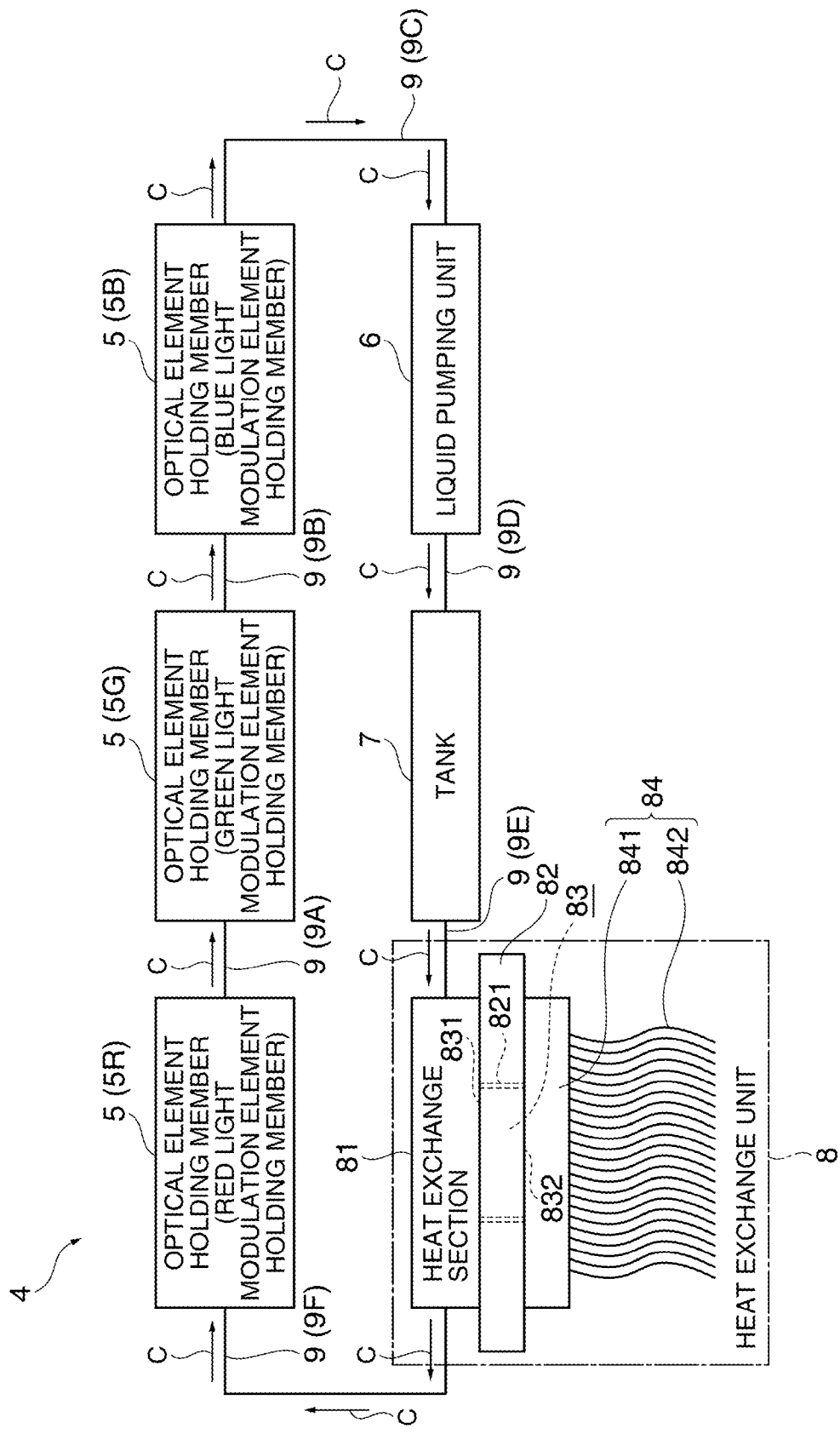
FIG. 2 is a diagram schematically showing a configuration of a liquid-cooling device in the present embodiment.

Further, in the optical unit 3, according to the configuration described above, the light beams emitted from the pair of light source devices 31A, 31B are reflected by the reflecting mirror 31C along an illumination light axis Ax (FIG. 1) set inside the optical component housing 36, and are then emitted to the illumination optical device 32. The light beams emitted to the illumination optical device 32 are equalized in in-plane illuminance by the illumination optical device 32, and at the same time, separated by the color separation optical device 33 into three colored light beams of red (R), green (G), and blue (B). The colored light beams thus obtained by the separation are respectively modulated by the respective liquid crystal panels 341 in accordance with the image information, and thus the images of the respective colored light beams are formed. The images of the respective colored light beams are combined by the cross dichroic prism 344, and then projected on the screen (not shown) via the projection lens 35.
Configuration of Liquid-Cooling Device FIG. 2 is a diagram schematically showing the configuration of the liquid-cooling device 4.

The cooling device 4 circulates a cooling liquid such as water or ethylene glycol along the circular channel to thereby cool the liquid crystal panel 341 with the cooling liquid. As shown in FIG. 2, the liquid-cooling device 4 is provided with three optical element holding members 5, a liquid pumping unit 6, a tank 7 as a liquid accumulation section, a heat exchange unit 8, and a plurality of liquid circulation members 9.

The plurality of liquid circulation members 9 is formed of tube like members allowing the cooling liquid to flow inside, and connects the members 5 through 8 to form a circular channel.

It should be noted that the structure of connecting the members 5 through 8 using the liquid circulation members 9 will be described later.
Configuration of Optical Element Holding Member Firstly, before explaining the configuration of the optical element holding member 5, the configuration of the liquid crystal panel 341 will be explained. It should be noted that the liquid crystal panels 341 have substantially the same configurations, and one of the liquid crystal panels 341 will hereinafter be explained alone.

The liquid crystal panel 341 has a configuration in which liquid crystal, which is an electrooptic material, is encapsulated in a pair of substrates 341C, 341D (see FIGS. 9 and 10) made of glass or the like.

The substrate 341C, one of the pair of substrates 341C, 341D, is a drive substrate for driving the liquid crystal, and is provided with a plurality of data lines, a plurality of scan lines, pixel electrodes formed so as to correspond to intersections between the scan lines and the data lines, and switching elements such as thin film transistors (TFT) although specific illustration thereof is omitted.

Further, the substrate 341D, the other of the pair of substrates, is an opposed substrate disposed so as to be opposed to the substrate 341C with a predetermined space, and is provided with a common electrode to which a predetermined voltage Vcom is applied.

Figure 9:
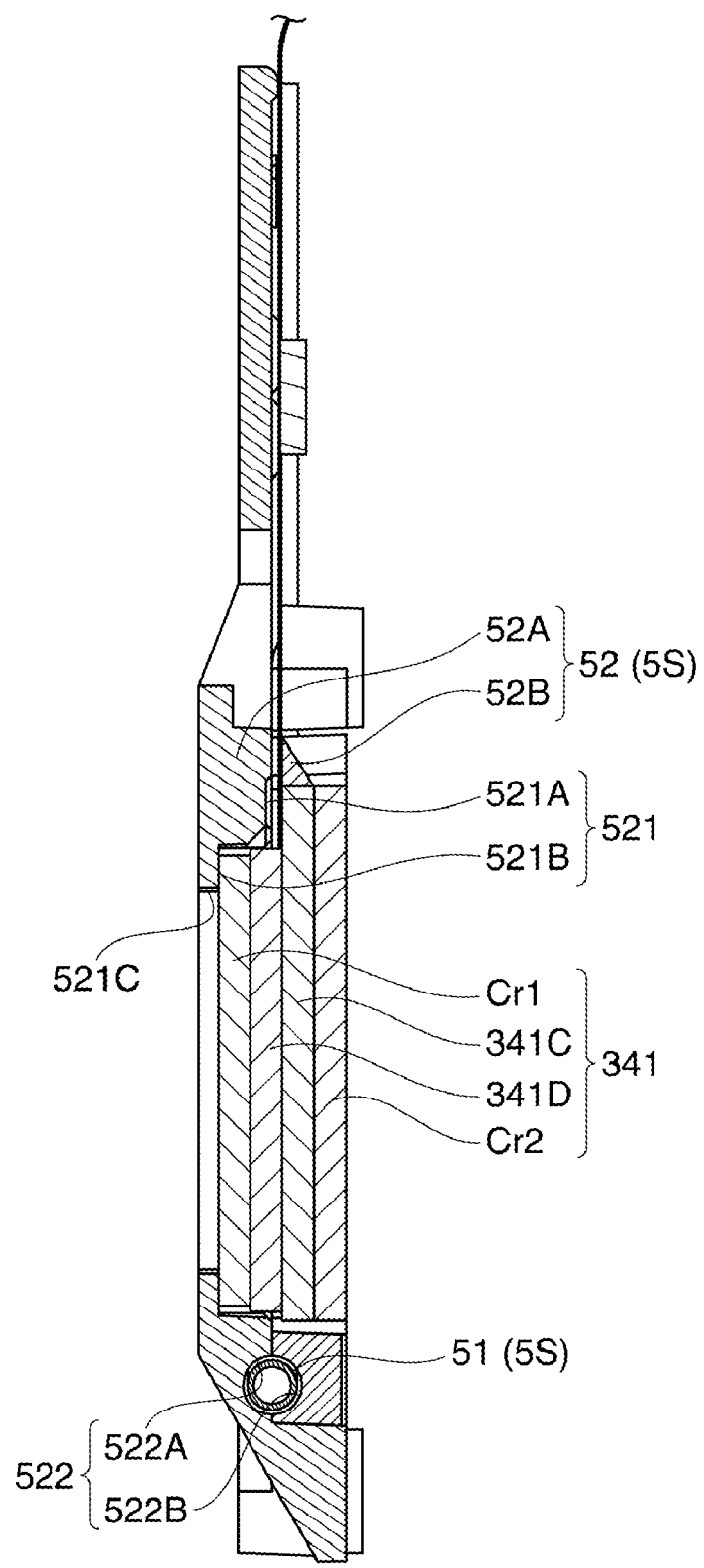
FIG. 9 is a diagram showing the configuration of the optical element support frame in the present embodiment.
Figure 10:
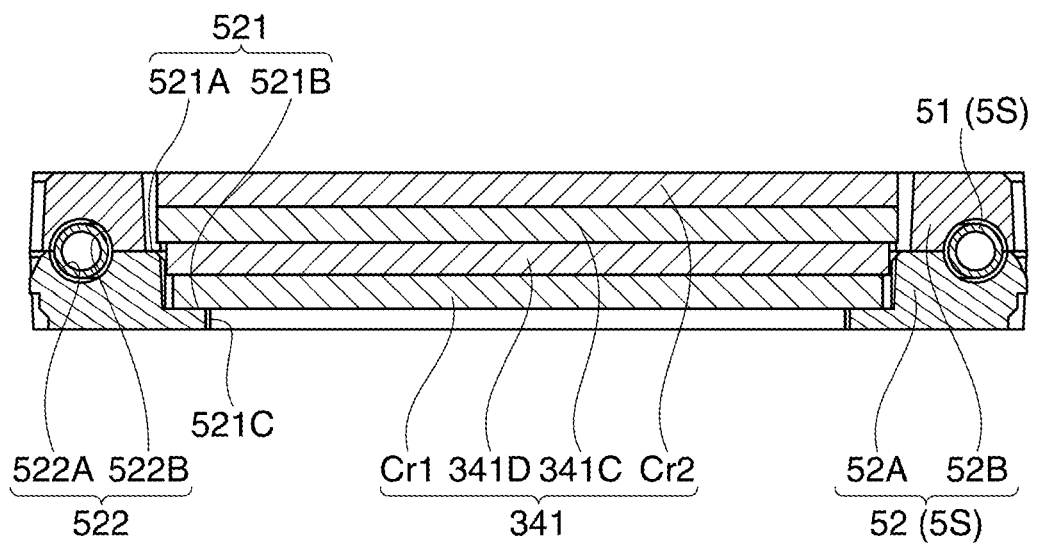
FIG. 10 is a diagram showing the configuration of the optical element support frame in the present embodiment.

Further, the drive substrate 341C described above is formed so as to have an outer shape larger than the outer shape of the opposed substrate 341D (see FIGS. 9 and 10).

Further, an entrance side dust-proof glass Cr1, which is a first translucent substrate having an outer shape substantially the same as the outer shape of the opposed substrate 341D, is attached to the outer surface of the opposed substrate 341D (see FIGS. 9 and 10).

Still further, an exit side dust-proof glass Cr2, which is a second translucent substrate having an outer shape substantially the same as the outer shape of the drive substrate 341C, is also attached to the outer surface of the drive substrate 341C (see FIGS. 9 and 10).

It should be noted that a detailed configuration of each of the dust-proof glasses Cr1, Cr2 will be described later.

Figure 3:
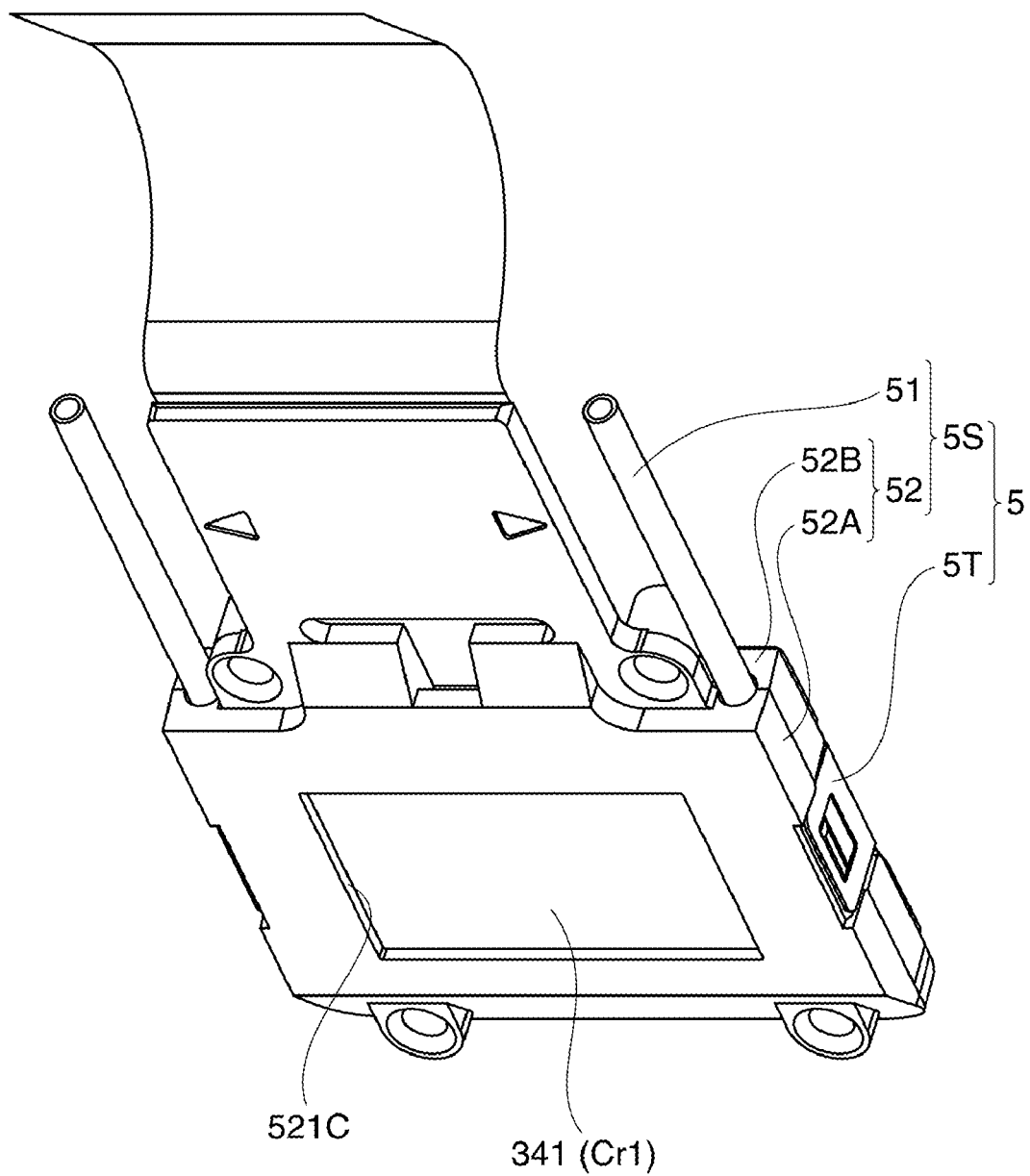
FIG. 3 is a diagram showing a configuration of an optical element holding member in the present embodiment.
Figure 4:
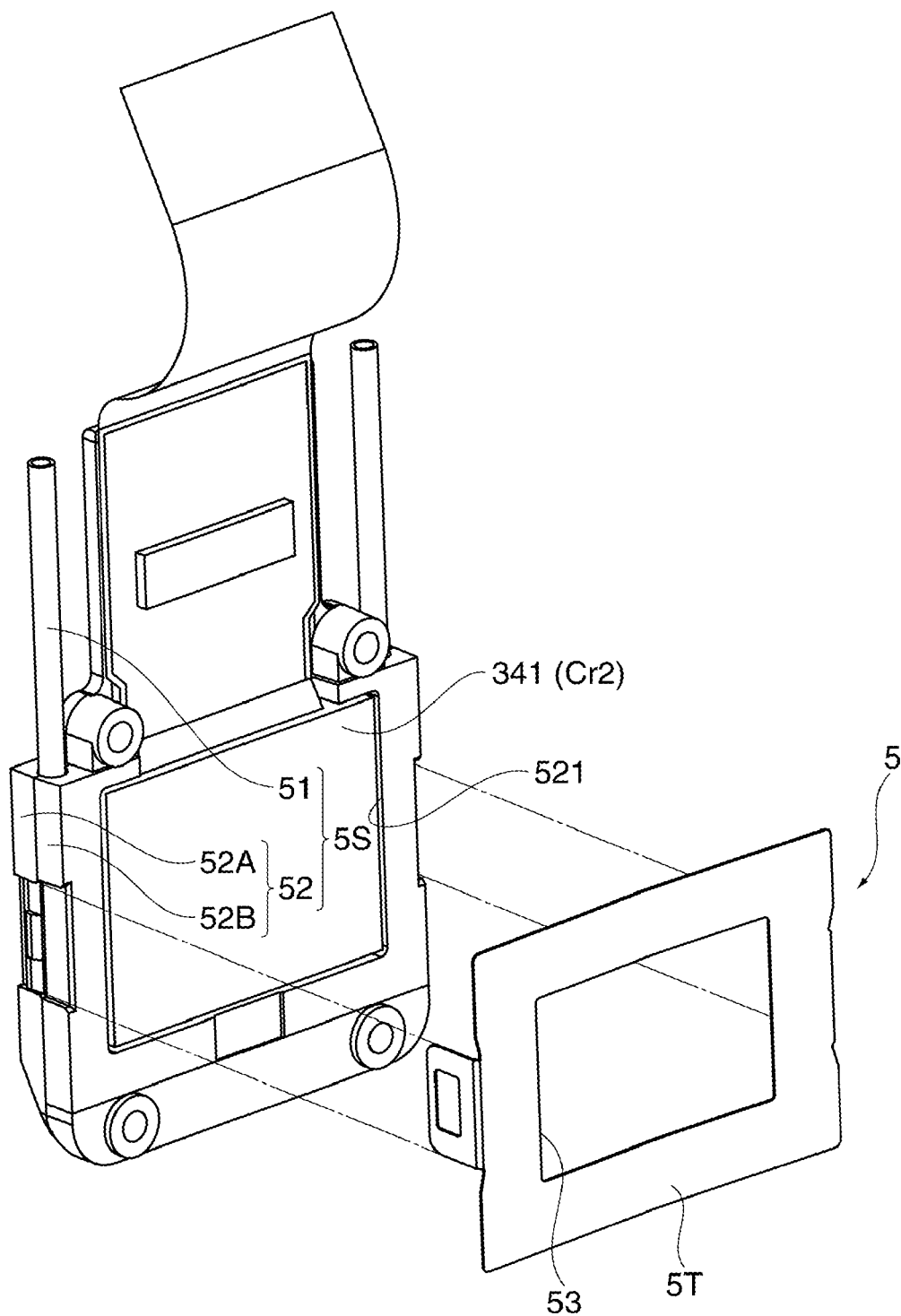
FIG. 4 is a diagram showing the configuration of the optical element holding member in the present embodiment.

FIGS. 3 and 4 are diagrams showing the configuration of the optical element holding member 5. Specifically, FIG. 3 is a perspective view of the optical element holding member 5 viewed from a light beam entrance side, and FIG. 4 is an exploded perspective view of the state of detaching a holding plate 5T from a holding member main body 5S viewed from a light beam exit side.

The three optical element holding members 5 respectively hold the three liquid crystal panels 341 (including the respective dust-proof glasses Cr1, Cr2), and at the same time, the cooling liquid flows into and out from the inside thereof to thereby cool the three liquid crystal panels 341, respectively, with the cooling liquid. It should be noted that the optical element holding members 5 have substantially the same configurations, and one of the optical element holding members 5 will hereinafter be explained alone.

As shown in FIG. 3 or 4, the optical element holding member 5 is provided with the holding member main body 5S and the holding plate 5T.

As shown in FIG. 3 or 4, the holding member main body 5S is provided with a liquid circulation pipe 51 and an optical element support frame 52.

The liquid circulation pipe 51 is a member, which is made of a metal material such as copper, and the cooling liquid flows into and out from.

Figure 7:
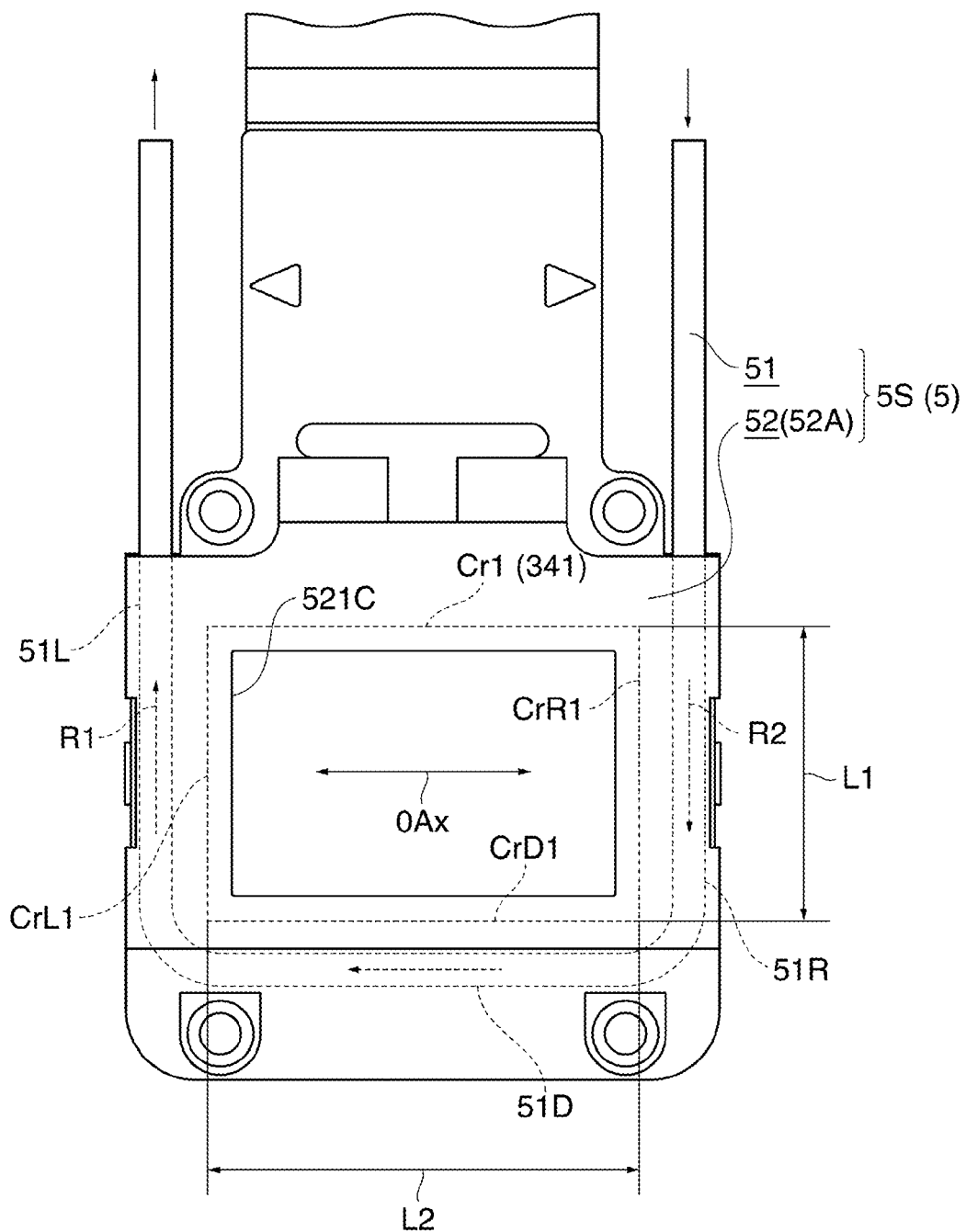
FIG. 7 is a diagram showing a positional relationship between an entrance side dust-proof glass and a liquid circulation pipe in the present embodiment.

The liquid circulation pipe 51 is formed in a curved manner so as to surround an image forming area (a light transmitting area) of the liquid crystal panel 341 in a plan view, and is formed so that the end portions thereof, through which the cooling liquid flows into and out from the liquid circulation pipe 51, extend upward in parallel to each other (see FIG. 7).

The optical element support frame 52 is made of a metal material such as an aluminum alloy, has a substantially rectangular plate shape, and supports the liquid crystal panel 341. Further, the liquid circulation pipe 51 is disposed inside the optical element support frame 52 so as to be opposed to side edge portion of the liquid crystal panel 341 (see FIGS. 7, 9, 10).

In the optical element support frame 52, on the light beam exit side end face, there is formed a housing recess 521 for housing the liquid crystal panel 341 as shown in FIG. 4.

Specifically, the housing recess 521 is composed of a first recess 521A hollowing from the light beam exit side end face of the optical element support frame 52 toward the light beam entrance side, and a second recess 521B hollowing further from a bottom portion of the first recess 521A toward the light beam entrance side, and has side walls formed stepwise so as to correspond to the outer shape (a stepwise shape due to the difference in the outer shape between the drive substrate 341C and the opposed substrate 341D) of the liquid crystal panel 341 (see FIGS. 9 and 10).

Further, the bottom portion of the second recess 521B is provided with an opening section 521C corresponding to the light transmitting area as shown in FIG. 3.

As shown in FIG. 4, the holding plate 5T is formed of a substantially rectangular plate member having an opening section 53 corresponding to the light transmitting area, and is disposed on the light beam exit side of the holding member main body 5S.

The holding plate 5T is formed to have a leaf spring shape, and is engaged to the lateral side edge portions of the optical element support member 52, thereby pressing the liquid crystal panel 341 housed in the housing recess 521 (the exit side duct-proof glass Cr2) toward the light beam entrance side in the peripheral area of the opening section 53.

Therefore, since the holding plate 5T presses the liquid crystal panel 341 toward the light beam entrance side, the light beam entrance side end face of the entrance side dust-proof glass Cr1 has a surface contact with a bottom portion of the second recess 521B (see FIGS. 9 and 10).

As described above, the optical element holding member 5 is configured so as to release the heat of the liquid crystal panel 341 along a heat transfer path of "the liquid crystal panel 341"—"the entrance side dust-proof glass Cr1"—"the optical element support frame 52"—"the liquid circulation pipe 51."

It should be noted that the detailed configuration of the optical element support frame 52 will be described later.

Configuration of Liquid Pumping Unit

The liquid pumping unit 6 is a pump for sucking in and then pressure-feeding the cooling liquid, and circulates the cooling liquid along the circular channel.

The liquid pumping unit 6 has, for example, a configuration of disposing an impeller inside a hollow section, and the impeller rotates to suck and then pressure-feed the cooling liquid.

It should be noted that as the configuration of the liquid pumping unit 6, other configurations using diaphragms can also be adopted besides the configuration provided with the impeller described above.

Configuration of Tank

Figure 5:
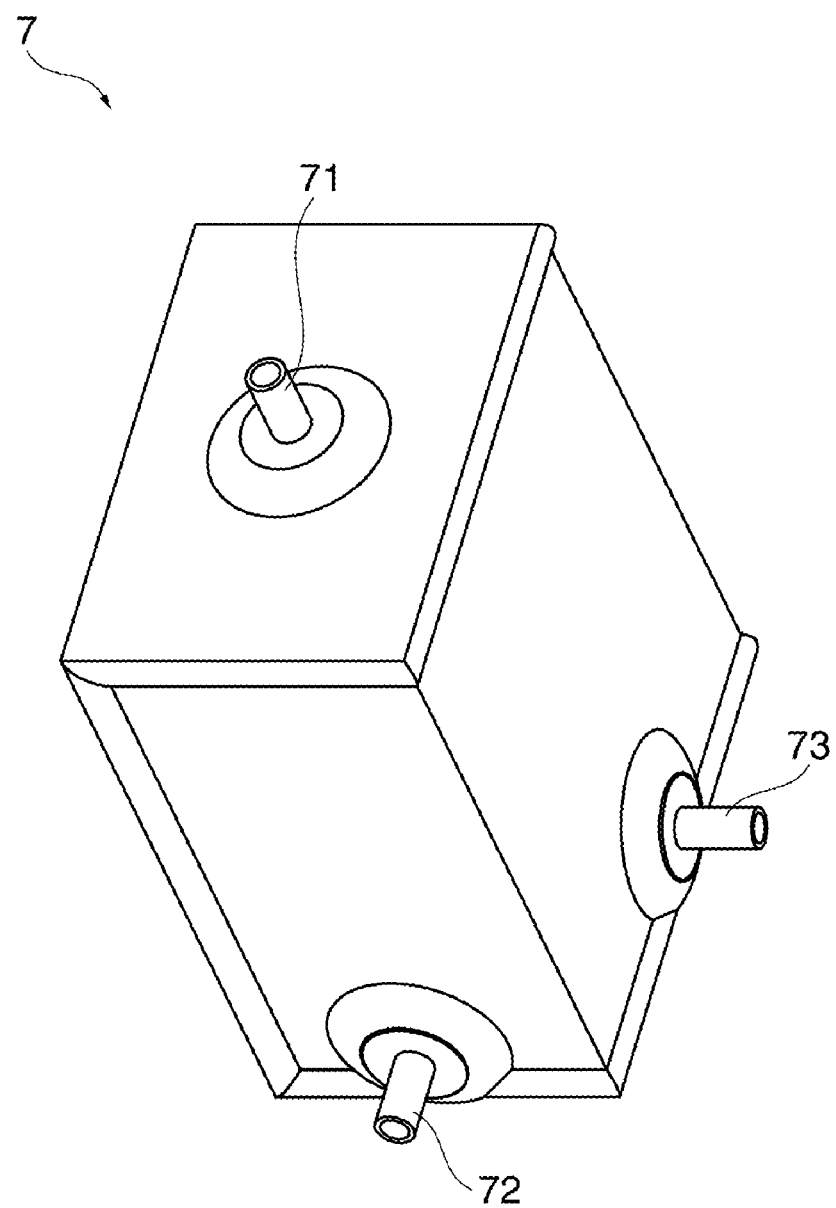
FIG. 5 is a perspective view showing a configuration of a tank in the present embodiment.

FIG. 5 is a perspective view showing the configuration of the tank.

The tank 7 is formed of a substantially rectangular solid shaped hollow member, and temporarily accumulates the cooling liquid flowing therein, and the cooling liquid then flows out therefrom.

In the tank 7, as shown in FIG. 5, on the upper end face, there is disposed an inlet section 71 communicating with the inside thereof for injecting the cooling liquid into the tank 7.

In other words, by injecting the cooling liquid via the inlet section 71 after assembling the liquid-cooling device 4, the liquid-cooling device 4 is automatically filled with the cooling liquid.

It should be noted that although not shown in FIG. 5, a cap for sealing the inlet section 71 is attached to the inlet section 71 after injecting the cooling liquid thereto.

Further, in the tank 7, two side faces thereof are respectively provided with an inflow section 72 and an outflow section 73 communicating with the inside of thereof and for allowing the cooling liquid to flow in thereto and out therefrom as shown in FIG. 5.

Further, the tank 7 described above is made of a metal material such as aluminum.

Configuration of Heat Exchange Unit

The heat exchange unit 8 lowers the temperature of the cooling liquid flowing along the circular channel. As shown in FIG. 2, the heat exchange unit 8 is provided with a heat exchange section 81, a separating plate 82, a Peltier element 83 as a thermoelectric conversion element, and a heat radiation side heat transfer member 84.

Figure 6:
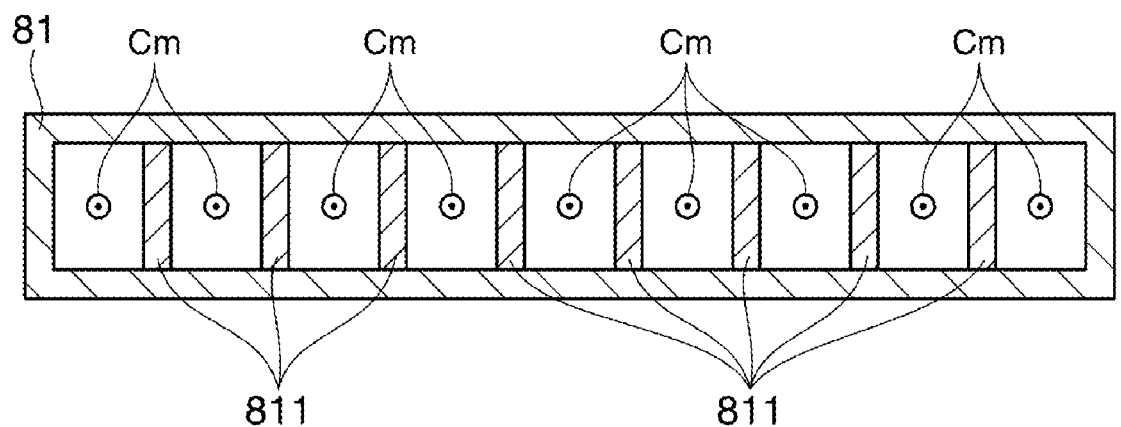
FIG. 6 is a cross-sectional view schematically showing an internal structure of a heat exchange section in the present embodiment.

FIG. 6 is a cross-sectional view schematically showing the internal structure of the heat exchange section 81. Specifically, FIG. 6 shows a cross-sectional surface of the heat exchange section 81 cut with a plane orthogonal to the channel.

The heat exchange section 81 is formed of a hollow member having a substantially rectangular solid shape, and performs heat exchange with the cooling liquid flowing inside.

As shown in FIG. 6, in the inside of the heat exchange section 81, there is disposed a plurality of plate members 811, each extending along the flow direction of the cooling liquid, in a direction orthogonal to the flow direction. Specifically, these plate members 811 each have a thickness dimension of, for example, about several tens through several hundreds of micrometers, and are arranged at intervals of about several tens through several hundreds of micrometers with each other.

According to the configuration described above, a plurality of fine channels Cm (FIG. 6) through which the cooling liquid flows is formed between the respective plate members 811 inside the heat exchange section 81. In other words, the heat exchange section 81 is composed of heat exchangers such as so-called microchannels.

The separating plate 82 is formed of a plate member having a rectangular planar shape, and separates the heat exchange section 81 from the heat radiation side heat transfer member 84, and at the same time, integrates the heat exchange section 81, a Peltier element 83, and the heat radiation side heat transfer member 84. The separating plate 82 is made of a material with low thermal conductivity (e.g., 0.9 W/(m·K) or lower).

As shown in FIG. 2, the separating plate 82 is provided with an opening section 821 having a rectangular shape smaller than a planar shape of the heat exchange section 81 and for making it possible to fit the Peltier element 83 therein.

Further, the heat exchange section 81 is fixed to the peripheral area of the opening section 821 so as to block the opening section 821 on one surface of the separating plate 82.

Although specific illustration is omitted, the Peltier element 83 has a plurality of conjugating pairs each formed by bonding a p-type semiconductor and an n-type semiconductor with a metal piece, and these conjugating pairs are electrically and directly connected to each other.

In the Peltier element 83 having such a configuration, when the power is supplied thereto, one of the end faces of the Peltier element 83 forms a heat absorbing surface 831 for absorbing the heat, while the other of the end faces forms a heat radiating surface 832 for radiating the heat as shown in FIG. 2.

Further, the Peltier element 83 is fitted into the opening section 821 of the separating plate 82, and the heat absorbing surface 831 is connected to the heat exchange section 81 in a manner of enabling heat transfer.

As shown in FIG. 2, the heat radiation side heat transfer member 84 is formed of a so-called heat sink having a plate member 841 with a rectangular shape and a plurality of fin members 842 projecting from the plate member 841. Further, the heat radiation side heat transfer member 84 is fixed to the peripheral area of the opening section 821 so as to block the opening section 821 on the other surface of the separating plate 82. In this state, the heat radiation side heat transfer member 84 is connected to the heat radiation surface 832 of the Peltier element 83 in a manner of enabling heat transfer.

In other words, in the state in which the members 81, 83, and 84 are integrated with the separating plate 82, a heat transfer path of "the heat exchange section 81"—"the Peltier element 83"—"the heat radiation side heat transfer member 84" is formed.

Therefore, when driving the Peltier element 83, the heat of the heat exchange section 81 is absorbed by the heat absorbing surface 831, and thus, the heat exchange section 81 is cooled. Further, the heat generated on the heat radiation surface 832 of the Peltier element 83 is radiated to the outside via the heat radiation side heat transfer member 84.

Coupling Structure with Liquid Circulation Member

Then, a coupling structure of the members 5 through 8 using the liquid circulation members 9 will be explained.

It should be noted that as shown in FIG. 2, hereinafter the optical element holding member for holding the liquid crystal panel 341R on the red light side among the three optical element holding members 5 is denoted as a red light modulation element holding member 5R, the optical element holding member for holding the liquid crystal panel 341G on the green light side is denoted as a green light modulation element holding member 5G, and the optical element holding member for holding the liquid crystal panel 341B on the blue light side is denoted as a blue light modulation element holding member 5B, for the sake of convenience of explanation.

As shown in FIG. 2, the liquid circulation members 9 are composed of 6 members of first through sixth liquid circulation members 9A through 9F.

Specifically, the first liquid circulation member 9A has an inflow side and an outflow side respectively coupled to one ends of the liquid circulation pipes 51 in the red light modulation element holding member 5R and the green light modulation element holding member 5G.

The second liquid circulation member 9B has an inflow side coupled to the other end of the liquid circulation pipe 51 in the green light modulation element holding member 5G, and an outflow side coupled to one end of the liquid circulation pipe 51 in the blue light modulation element holding member 5B.

The third liquid circulation member 9C has an inflow side coupled to the other end of the liquid circulation pipe 51 in the blue light modulation element holding member 5B, and an outflow side coupled to the liquid pumping unit 6.

The fourth liquid circulation member 9D has an inflow side and an outflow side respectively coupled to the liquid pumping unit 6 and the inflow section 72 (see FIG. 5) of the tank 7.

The fifth liquid circulation member 9E has an inflow side and an outflow side respectively coupled to the outflow section 73 (see FIG. 5) of the tank 7 and the heat exchange section 81.

The sixth liquid circulation member 9F has an inflow side and an outflow side respectively coupled to the heat exchange section 81 and the other end of the liquid circulation pipe 51 in the red light modulation element holding member 5R.

According to the coupling structure using the liquid circulation members 9 described above, there is formed a circular channel C passing through "the red light modulation element holding member 5R"—"the green light modulation element holding member 5G"—"the blue light modulation element holding member 5B"—"the liquid pumping unit 6"—"the tank 7"—"the heat exchange section 81" and then returning again to "the red light modulation element holding member 5R."

Further, the liquid-cooling device 4 described above cools the liquid crystal panel 341 as described below. Specifically, the heat generated in the liquid crystal panel 341 is transferred to the cooling liquid via the entrance side dust-proof glass Cr1 and the optical element holding members 5.

The cooling liquid flowing out from the optical element holding members 5 flows in the heat exchange section 81 after passing through the channel C.

Here, when driving the Peltier element 83, the heat of the heat exchange section 81 is absorbed by the heat absorbing surface 831, and thus, the heat exchange section 81 is cooled. Therefore, the cooling liquid flowing into the heat exchange section 81 is cooled due to the heat exchange performed between the cooling liquid and the heat exchange section 81 while the cooling liquid flows through the internal fine channels Cm.

Subsequently, the cooling liquid cooled in the heat exchange section 81 flows into the optical element holding members 5 again.

Configuration of Entrance Side Dust-Proof Glass

FIG. 7 is a diagram showing a positional relationship between the entrance side dust-proof glass Cr1 and the liquid circulation pipe 51. Specifically, FIG. 7 is the plan view showing the optical element holding member 5 viewed from the light beam entrance side thereof.

The entrance side dust-proof glass Cr1 is formed of an optical crystal material having the thermal conductivity in a direction parallel to the optical axis OAx (FIG. 7) higher than the thermal conductivity in a direction orthogonal to the optical axis OAx.

In the present embodiment, the entrance side dust-proof glass Cr1 is formed of a rectangular plate shaped quartz crystal having a longitudinal direction set to be the lateral direction.

Further, the entrance side dust-proof glass Cr1 is set so that a dimension (hereinafter described as a dimension A) obtained by adding the length dimensions L1 of the left side end section (an opposed side end section) CrL1 and the right side end section (the opposed side end section) CrR1 becomes larger than the length dimension L2 (hereinafter described as a dimension B) of the lower end section (an adjacent side end section) CrD1 adjacent to both of the side end sections CrL1, CrR1.

Further, as shown in FIG. 7, the entrance side dust-proof glass Cr1 is formed so as to have the optical axis OAx orthogonal to both of the side end sections CrL1, CrR1. In other words, the dust-proof glass Cr1 is formed so as to have the optical axis OAx arranged in the longitudinal direction.

Configuration of Optical Element Support Frame

Figure 8:
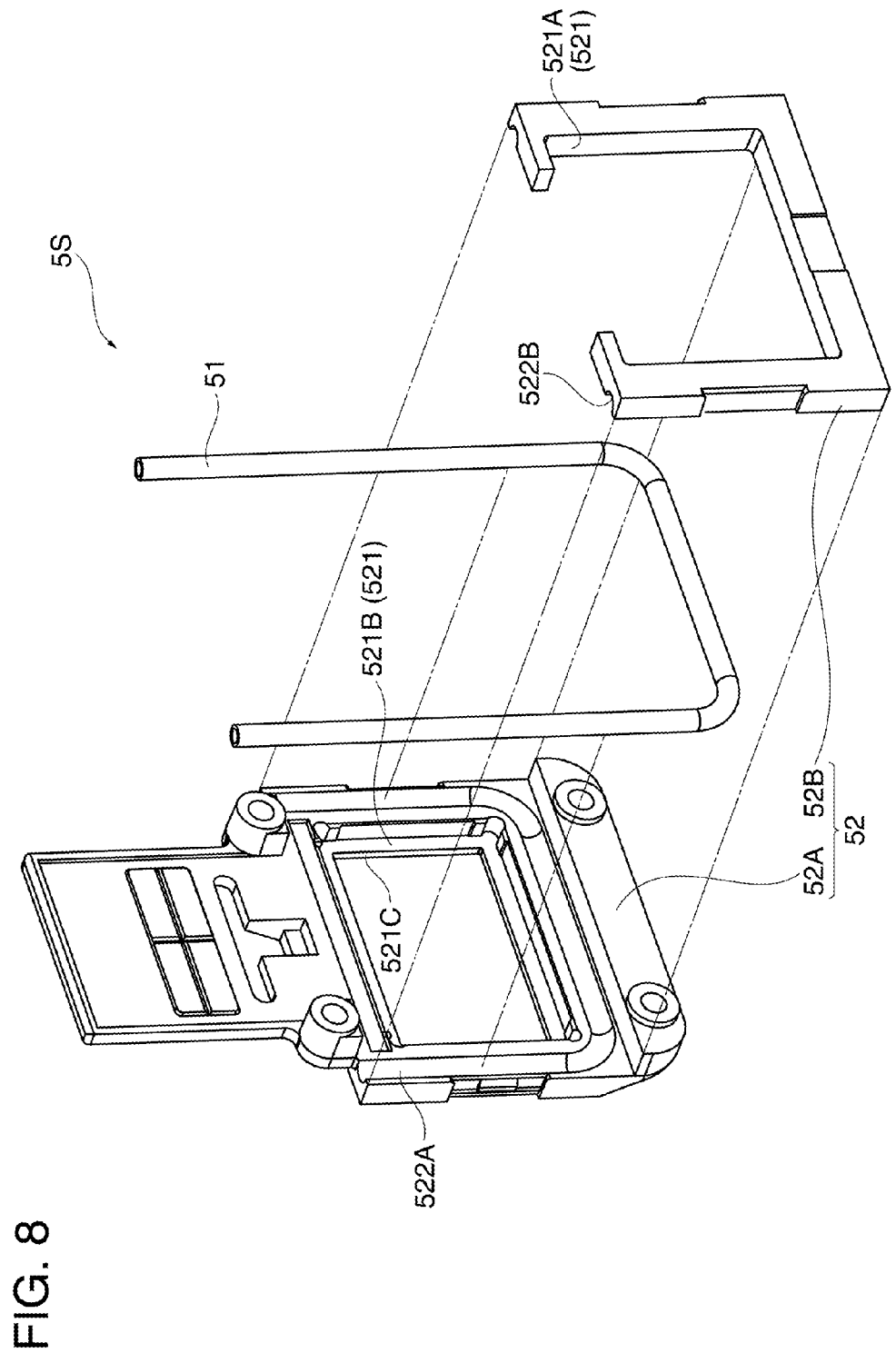
FIG. 8 is a diagram showing a configuration of the optical element support frame in the present embodiment.

FIGS. 8 and 10 are diagrams showing the configuration of the optical element support frame 52. Specifically, FIG. 8 is an exploded perspective view showing the optical element support frame 52 viewed from the light beam exit side thereof. FIG. 9 is a vertical cross-sectional view of the optical element support frame 52. FIG. 10 is a horizontal cross-sectional view of the optical element support frame 52.

As shown in FIGS. 8 through 10, the optical element support frame 52 is composed of an entrance side support frame (a first support frame) 52A and an exit side support frame (a second support frame) 52B formed so as to be divided by a plane substantially parallel to the flow directions of the liquid circulation pipe 51.

More specifically, the dividing position of the entrance side support frame 52A and the exit side support frame 52B is set to the bottom portion of the first recess 521A as shown in FIG. 9 or 10. In other wards, the dividing position of the entrance side support frame 52A and the exit side support frame 52B is set to substantially the same position as a connection surface between the drive substrate 341C and the opposed substrate 341D in the state in which the liquid crystal panel 341 is housed in the housing recess 521.

In the entrance side support frame 52A, the light beam exit side end face is provided with a first tube recess 522A having a U planar shape surrounding the housing recess 521 so as to correspond to the liquid circulation pipe 51 as shown in FIGS. 8 through 10.

Further, similarly in the exit side support frame 52B, the light beam entrance side end face is provided with a second tube recess 522B having a U planar shape surrounding the housing recess 521 so as to correspond to the liquid circulation pipe 51 as shown in FIGS. 8 through 10.

Therefore, by assembling the both support frames 52A, 52B to couple the both tube recesses 522A, 522B to each other, a through hole 522 in which the liquid circulation pipe 51 is disposed is formed as shown in FIGS. 9 and 10.

The both support frames 52A, 52B and the liquid circulation pipe 51 described above are bonded to each other by soldering.

It should be noted that as the soldering material the materials shown in Table 1 below can be cited as examples.

TABLE 1

|     | Alloy Composition (wt %) | Melting Point (° C.) |
| --- | --- | --- |
| (A) | Sn42%—Bi58% | 139 |
| (B) | Sn63%—Pb37% | 183 |
| (C) | Sn8%—Zn92% | 198 |
| (D) | Sn96.5%—Ag3%—Cu0.5% | 217 |
| (E) | Sn96.5%—Ag3.5% | 221 |
| (F) | Sn99.3%—Cu0.7% | 227 |

It should be noted that the both support frames 52A, 52B and the liquid circulation pipe 51 can be bonded not only by soldering but also by brazing as described below.

For example, the both support frames 52A, 52B and the liquid circulation pipe 51 (hereinafter referred to as bonding objects) are made of aluminum. Further, while melting the bonding objects in addition to a material having a three-layered structure described below, the bonding objects are bonded with the material having the three-layered structure.

As the material mentioned above, a material having a structure composed of the three layers of Al+Si layer (14%), Al+Mg+Ti layer (74%), and Al+Zn layer (12%) can be cited as an example.

Further, the melting point of the material described above is in a range of 560 through 580° C.

It should be noted that in the present embodiment the bonding is performed by soldering with the soldering material (e.g., one of the materials A through C in Table 1) having a melting point of equal to or lower than 200° C.

Configuration of Exit Side Dust-Proof Glass

Figure 11:
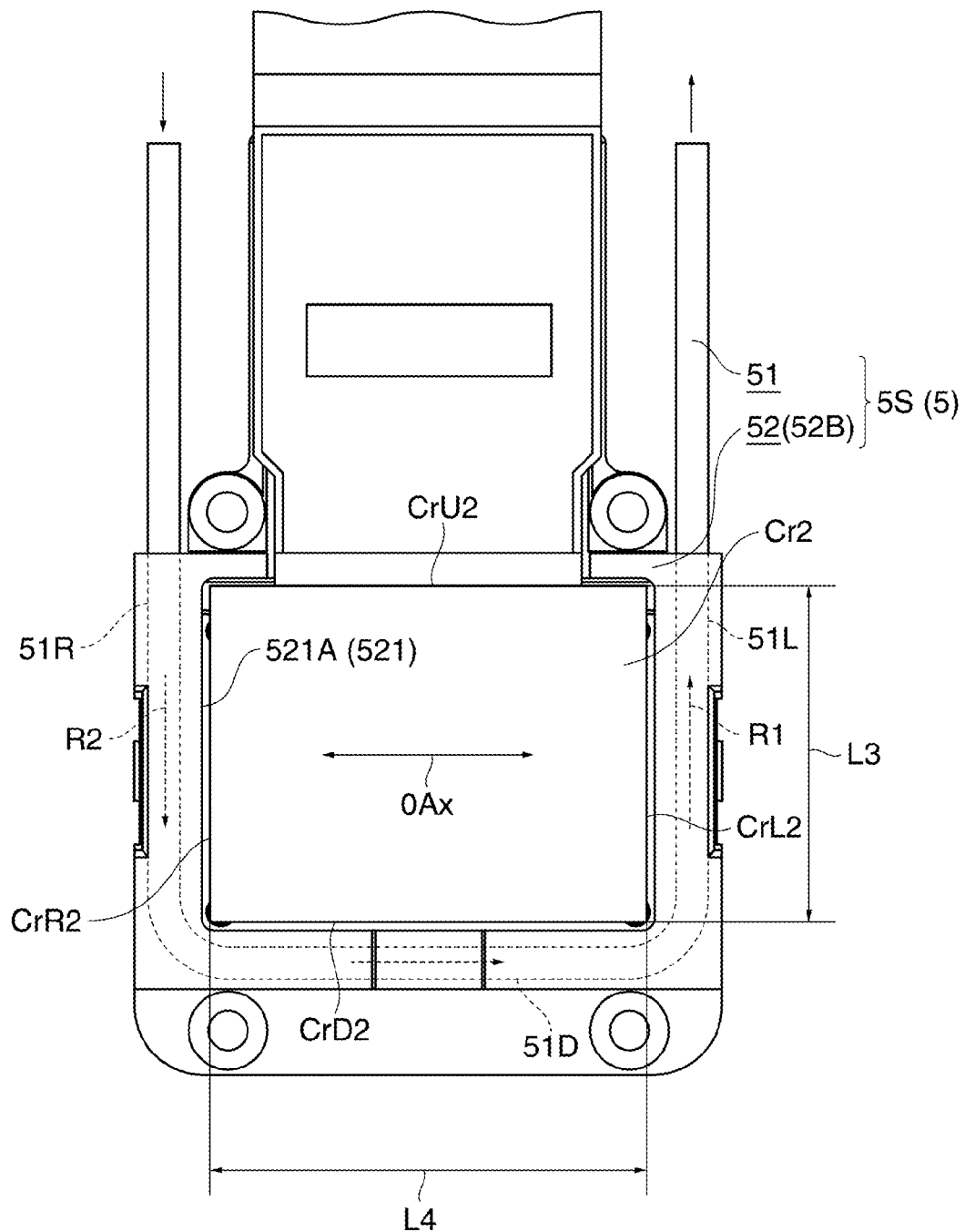
FIG. 11 is a diagram showing an exit side dust-proof glass in the present embodiment.

FIG. 11 is a diagram showing the exit side dust-proof glass Cr2. In other words, FIG. 11 is a plan view of the optical element holding member in the state of detaching the holding plate 5T viewed from the light beam exit side.

Similarly to the entrance side dust-proof glass Cr1, the exit side dust-proof glass Cr2 is made of an optical crystal material having the thermal conductivity in a direction (a lateral direction in FIG. 11) parallel to the optical axis OAx (FIG. 11) higher than the thermal conductivity in a direction (a vertical direction in FIG. 11) orthogonal to the optical axis OAx. In other words, the exit side dust-proof glass Cr2 has a configuration in which the heat of the exit side dust-proof glass Cr2 is apt to be conducted along the optical axis OAx.

Such an exit side dust-proof glass Cr2 is formed of a rectangular plate shaped quartz crystal, and has a left side end section CrL2 and a right side end section CrR2 as a pair of opposed side end sections opposed to each other, and an upper end section CrU2 and a lower end section CrD2 as adjacent side end sections sandwiched by the side end sections CrL2, CrR2 as shown in FIG. 11. Among these sections, the dimension L4 of each of the upper end section CrU2 and the lower end section CrD2 is larger than the dimension L3 of each of the left side end section CrL2 and the right side end section CrR2. Further, in the exit side dust-proof glass Cr2, the optical axis OAx is set to be parallel to the longitudinal direction, which is a direction along the upper end section CrU2 and the lower end section CrD2.

Such an exit side dust-proof glass Cr2 is attached to the drive substrate 341C so that the longitudinal direction is parallel to the lateral direction, and the optical axis OAx is substantially parallel to the optical axis OAx of the entrance side dust-proof glass Cr1.

It should be noted that the exit side dust-proof glass Cr2 has no contact with the exit side support frame 52B as shown in FIGS. 9 through 11 unlike the entrance side dust-proof glass Cr1. Therefore, a gap with a predetermined dimension is formed between the exit side dust-proof glass Cr2 and the first recess 521A.

Cooling of Exit Side Dust-Proof Glass

Figure 12:
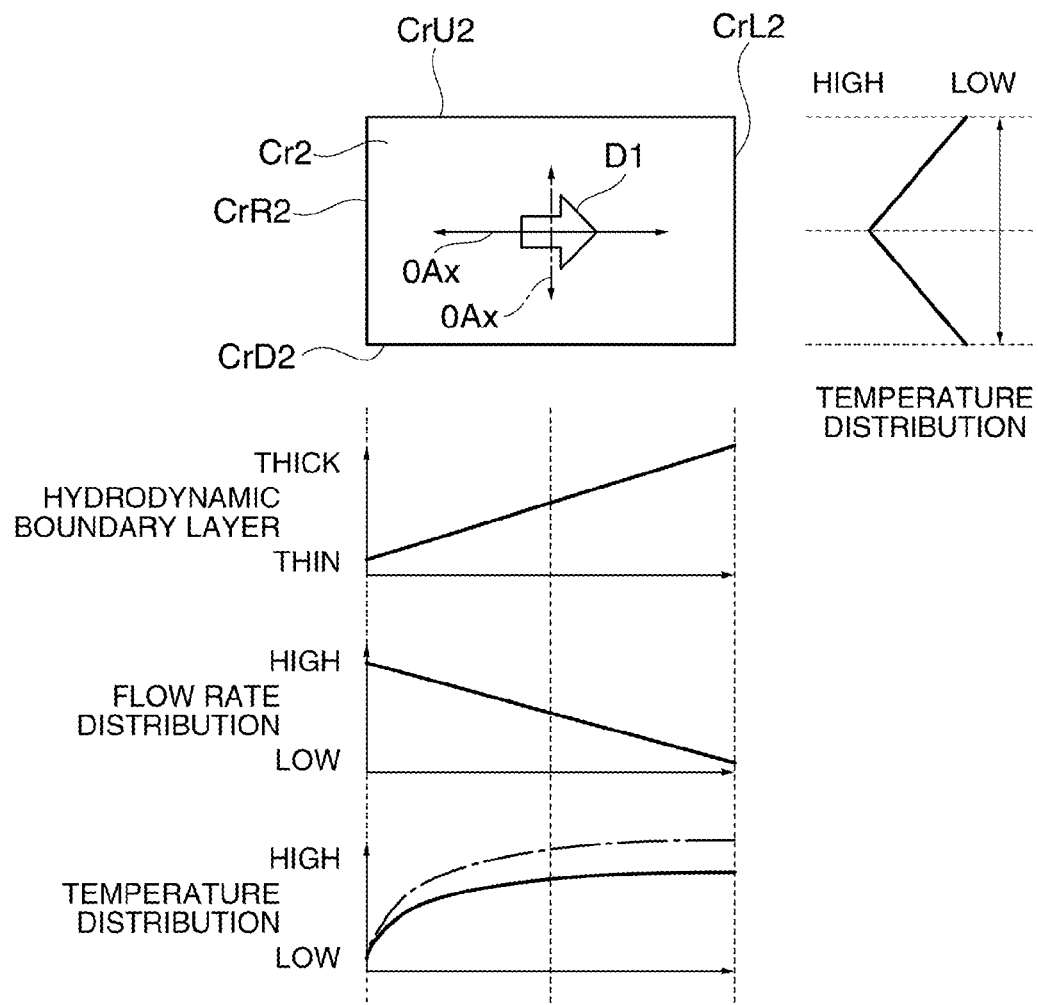
FIG. 12 is a schematic diagram showing the optical axis of the exit side dust-proof glass and the blowing direction of cooling air, and a cooling effect of the exit side dust-proof glass in the present embodiment.
Figure 13:
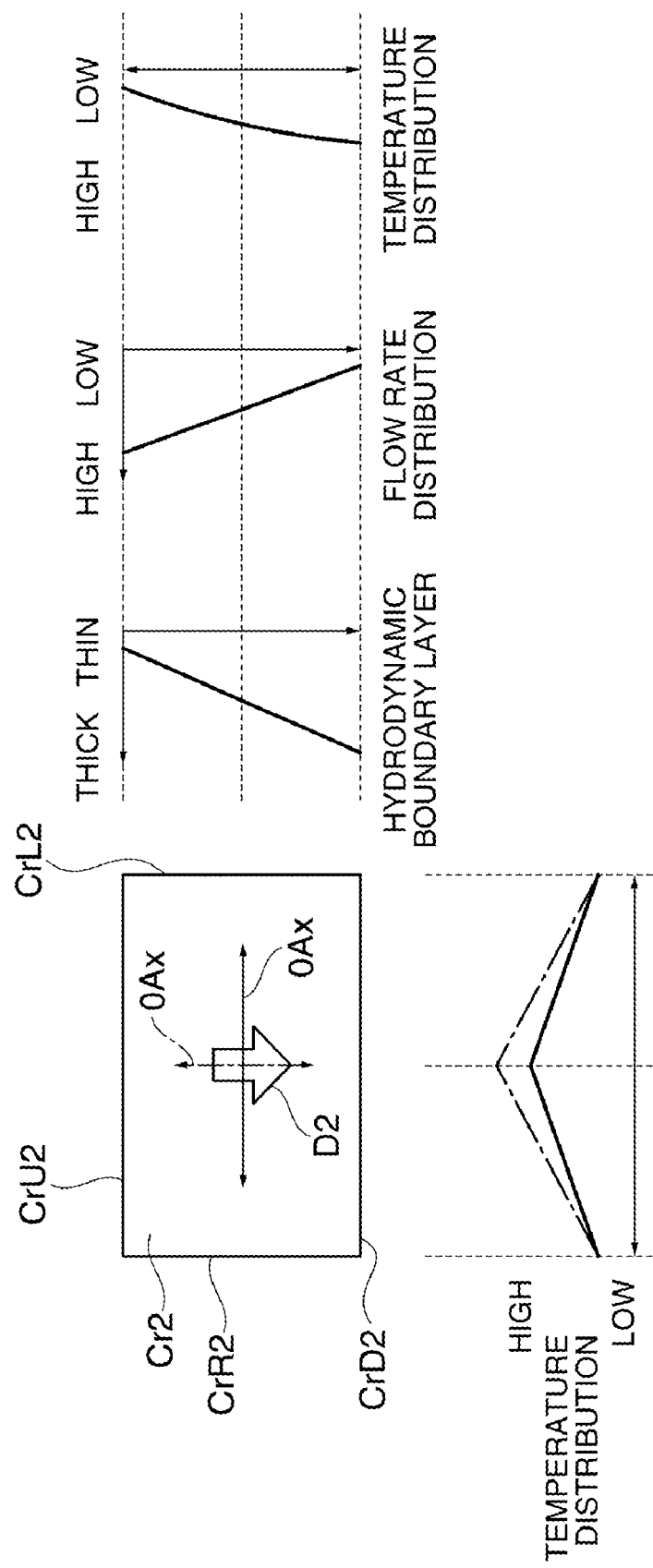
FIG. 13 is a schematic diagram showing the optical axis of the exit side dust-proof glass and the blowing direction of the cooling air, and the cooling effect of the exit side dust-proof glass in the present embodiment.

FIGS. 12 and 13 are schematic diagrams showing the optical axis OAx of the exit side dust-proof glass Cr2 and the blowing direction of the cooling air, and a cooling effect of the exit side dust-proof glass Cr2. It should be noted that FIGS. 12 and 13 show examples of the case in which the cooling air flows along the longitudinal direction and the case in which the cooling air flows along the short side direction, respectively. Further, the graphs of "hydrodynamic boundary layer," "flow rate distribution," and "temperature distribution" shown below the exit side dust-proof glass Cr2 in FIG. 12 respectively represent the thickness of the hydrodynamic boundary layer at each position, the flow rate distribution of the cooling air, and the temperature distribution of the exit side dust-proof glass Cr2 in the longitudinal direction, the graphs of "hydrodynamic boundary layer," "flow rate distribution," and "temperature distribution" shown on the right of the exit side dust-proof glass Cr2 in FIG. 13 respectively represent the thickness of the hydrodynamic boundary layer at each position, the flow rate distribution of the cooling air, and the temperature distribution of the exit side dust-proof glass Cr2 in the short side direction, the graph of "temperature distribution" shown on the right of the exit side dust-proof glass Cr2 in FIG. 12 represents the temperature distribution of the exit side dust-proof glass Cr2 in the short side direction, and the graph of "temperature distribution" shown below the exit side dust-proof glass Cr2 in FIG. 13 represents the temperature distribution of the exit side dust-proof glass Cr2 in the longitudinal direction.

As described above, the projector 1 is provided with the cooling device 10 (see FIG. 1) for feeding the cooling air to the liquid crystal panel 341 and the respective dust-proof glasses Cr1, Cr2. The case in which the cooling device 10 feeds the cooling air along the longitudinal direction of the exit side dust-proof glass Cr2 will hereinafter be explained.

In the case in which the cooling air flows in a direction of the arrow D1 along the longitudinal direction from the right side end section CrR2 toward the left side end section CrL2 of the exit side dust-proof glass Cr2, as shown in the graphs of "hydrodynamic boundary layer" and "flow rate distribution" in FIG. 12, the hydrodynamic boundary layer on the right side end section CrR2 side, which is a flow direction base end side (the windward side) of the cooling air, is thin, and the flow rate value of the cooling air is high. In contrast, the hydrodynamic boundary layer on the left side end section CrL2 side, which is a flow direction front side (the leeward side) of the cooling air, is thick, and the flow rate value of the cooling air is low.

Here, in the case (the case in which the optical axis OAx illustrated with a dashed line in FIG. 12 is provided) in which the optical axis OAx of the exit side dust-proof glass Cr2 is set to be parallel to the short side direction, the heat of the exit side dust-proof glass Cr2 is apt to be conducted in the short side direction orthogonal to the flow direction of the cooling air. In this case, although the right side end section CrR2 side, which is the flow direction base end side of the cooling air, is apt to be cooled, the left side end section CrL2 side, which is the flow direction front side, is hard to be cooled. Therefore, as illustrated with the dashed line in the graph of "temperature distribution" located below the exit side dust-proof glass Cr2 in FIG. 12, the in-plane temperature difference at each region of the exit side dust proof glass Cr2 in the longitudinal direction is large.

In contrast, in the case (the case in which the optical axis OAx illustrated with a solid line in FIG. 12 is provided) in which the optical axis OAx of the exit side dust-proof glass Cr2 is set to be parallel to the longitudinal direction, the heat of the exit side dust-proof glass Cr2 is apt to be conducted along the longitudinal direction parallel to the flow direction of the cooling air. In this case, as illustrated with the solid line in the graph of "temperature distribution" located below the exit side dust-proof glass Cr2 in FIG. 12, the temperature difference between the right side end section CrR2 side, which is the flow direction base end side of the cooling air, and the left side end section CrL2 side as the front side thereof is reduced compared to the case described above in which the optical axis OAx is set to be parallel to the short side direction.

It should be noted that the same is applied to the case in which the cooling air flows from the left side end section CrL2 side toward the right side end section CrR2 side.

As described above, when the cooling air flows along the longitudinal direction, the in-plane temperature difference can further be reduced with the optical axis OAx of the exit side dust-proof glass Cr2 set to be parallel to the longitudinal direction.

It should be noted that the temperature distribution of each region along the short side direction in the exit side dust-proof glass Cr2 has no substantial difference depending on the direction of the optical axis OAx as shown in the graph of "temperature distribution" located on the right side in FIG. 12.

Then, the case in which the cooling device 10 feeds the cooling air along the short side direction of the exit side dust-proof glass Cr2 will be explained.

In the case in which the cooling air flows in a direction of the arrow D2 along the short side direction from the upper end section CrU2 toward the lower end section CrD2 of the exit side dust-proof glass Cr2, as shown in the graphs of "hydrodynamic boundary layer" and "flow rate distribution" in FIG. 13, the hydrodynamic boundary layer on the upper end section CrU2 side, which is the flow direction base end side (the windward side) of the cooling air, is thin, and the flow rate value of the cooling air is high. In contrast, the hydrodynamic boundary layer on the lower end section CrD2 side, which is the flow direction front side (the leeward side) of the cooling air, is thick, and the flow rate value of the cooling air is low.

Here, in the case (the case in which the optical axis OAx illustrated with a dashed line in FIG. 13 is provided) in which the optical axis OAx of the exit side dust-proof glass Cr2 is set to be parallel to the short side direction, the heat of the exit side dust-proof glass Cr2 is apt to be conducted along the short side direction parallel to the flow direction of the cooling air. In this case, as illustrated with the dashed line in the graph of "temperature distribution" located below the exit side dust-proof glass Cr2 in FIG. 13, the cooling effect in the central portion in the longitudinal direction having the highest temperature is not so strong. Therefore, there is caused a large in-plane temperature difference between the central portion and the both end sections in the longitudinal direction of the exit side dust-proof glass Cr2.

In contrast, in the case (the case in which the optical axis OAx illustrated with a solid line in FIG. 13 is provided) in which the optical axis OAx of the exit side dust-proof glass Cr2 is set to be parallel to the longitudinal direction, the heat of the exit side dust-proof glass Cr2 is apt to be conducted along the longitudinal direction orthogonal to the flow direction of the cooling air. In this case, as illustrated with the solid line in the graph of "temperature distribution" located below the exit side dust-proof glass Cr2 in FIG. 13, although the temperature at the both ends in the longitudinal direction is substantially the same as in the case described above in which the optical axis OAx is set to be parallel to the short side direction, the temperature at the central portion in the longitudinal direction having the highest temperature becomes lower compared to the case described above. Therefore, the in-plane temperature difference between the central portion and the ends of the exit side dust-proof glass Cr2 is reduced.

It should be noted that the temperature distribution of each region along the short side direction in the exit side dust-proof glass Cr2 has no substantial difference depending on the direction of the optical axis OAx as shown in the graph of "temperature distribution" located on the right side in FIG. 13. Further, the same is applied to the case in which the cooling air flows from the lower end section CrD2 side toward the upper end section CrU2 side.

As described above, the in-plane temperature difference of the exit side dust-proof glass Cr2 can be made smaller with the optical axis OAx of the exit side dust-proof glass Cr2 set to be parallel to the longitudinal direction compared to the case in which the optical axis OAx thereof is set to be parallel to the short side direction. Further, in the case in which the optical axis OAx is set to be parallel to the longitudinal direction, the in-plane temperature difference in the longitudinal direction of the exit side dust-proof glass Cr2 can be made smaller with the cooling air flowing along the short side direction compared to the case in which the cooling air flows along the longitudinal direction.

Therefore, in the present embodiment, the cooling device 10 feeds the cooling air so that the cooling air flows in the short side direction orthogonal to the optical axis OAx set to be parallel to the longitudinal direction in the exit side dust-proof glass Cr2.

Figure 14:
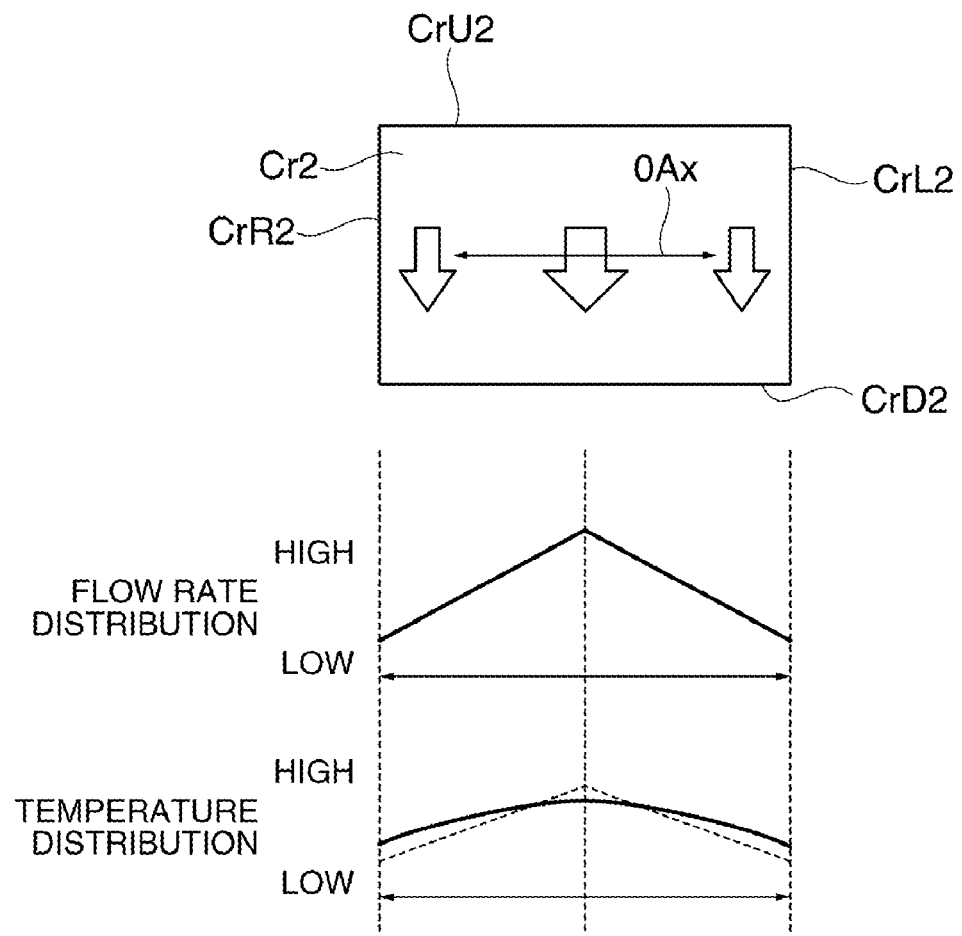
FIG. 14 is a schematic diagram showing a relationship between a flow rate value of the cooling air and the temperature at each region in a longitudinal direction of the exit side dust-proof glass in the present embodiment.

FIG. 14 is a schematic diagram showing a relationship between a flow rate value of the cooling air and the temperature at each region in the longitudinal direction of the exit side dust-proof glass Cr2.

Here, the cooling device 10 of the present embodiment adjusts the flow rate value of the cooling air determined by the performance of the fan so that the flow rate value of the cooling air supplied to the central portion in the longitudinal direction of the exit side dust-proof glass Cr2 becomes the highest, and the flow rate value of the cooling air gradually decreases along the directions from the central portion toward the both ends in the longitudinal direction. In a detailed description, as shown in the graph of "flow rate distribution" of FIG. 14, the cooling device 10 feeds the cooling air so that the flow rate value of the cooling air flowing along the exit side dust-proof glass Cr2 and the distance value from the central portion toward the ends in the longitudinal direction of the exit side dust-proof glass Cr2 have a linear relationship (a proportional relationship).

Specifically, it is arranged that the flow rate value and the distance value have the relationship expressed by the formulas 1 and 2 below. It should be noted that "R" and "D" in the formula 1 denote the thermal resistance and the surface area of the exit side dust-proof glass Cr2, respectively. Further, "h" in the formulas 1 and 2 denotes the thermal conductivity, and "V" and "L" in the formula 2 respectively denote the flow rate value and the distance value from the central portion to the end portions in the longitudinal direction of the exit side dust-proof glass Cr2.

$$R = 1/(D \times h) \qquad (1)$$

$$h = 3.86 \times \sqrt{(V/L)} \qquad (2)$$

By thus setting the flow rate value of the cooling air, although the cooling effect in the vicinity of the both end sections in the longitudinal direction (the right side end section CrR2 and the left side end section CrL2) is weakened, the cooling effect in the central portion becomes stronger, and the central portion is effectively cooled as shown in the graph of "temperature distribution" in FIG. 14. Thus, the in-plane temperature difference in the longitudinal direction of the exit side dust-proof glass Cr2 can be made smaller.

It should be noted that some of the cooling air fed from the cooling device 10 is also fed to the entrance side dust-proof glass Cr1 similar to the case of the exit side dust-proof glass Cr2.

Position Showing the Highest Temperature in Liquid Crystal Panel

Figure 15A:
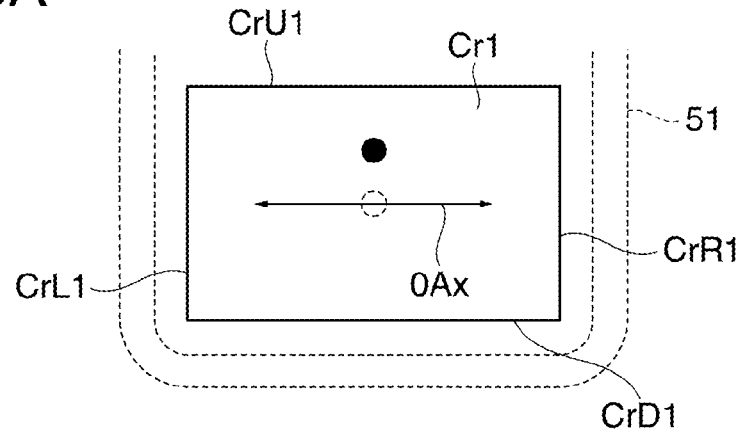
FIGS. 15A to 15C are schematic diagrams showing a position having the highest temperature of all of the entrance side dust-proof glass, the exit side dust-proof glass, and the liquid crystal panel in the present embodiment.
Figure 15B:
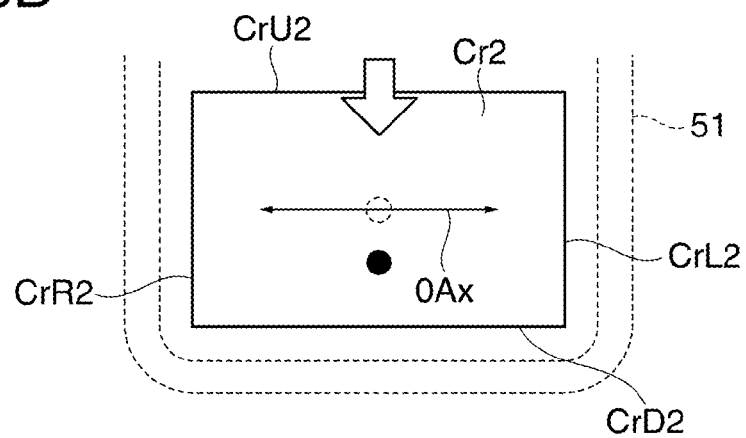
Figure 15C:
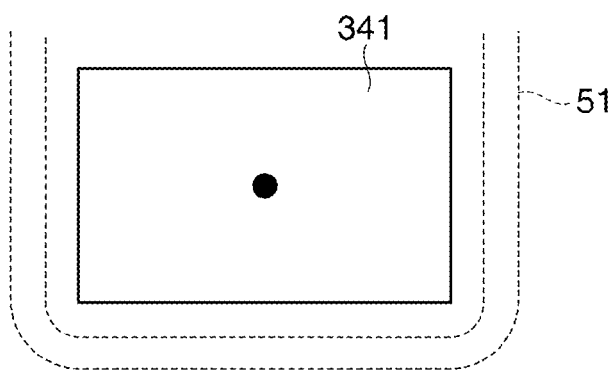

FIGS. 15A through 15C are schematic diagrams showing a position where the temperature becomes the highest of all of the entrance side dust-proof glass Cr1, the exit side dust-proof glass Cr2, and the liquid crystal panel 341.

In the entrance side dust-proof glass Cr1, it is set that the thermal conductivity in a direction parallel to the optical axis OAx is higher than the thermal conductivity in a direction orthogonal to the optical axis OAx, and the optical axis OAx is parallel to the longitudinal direction of the entrance side dust-proof glass Cr1 as described above. Therefore, in the entrance side dust-proof glass Cr1, the heat is apt to be conducted from the right side end section CrR1 and the left side end section CrL1 orthogonal to the optical axis OAx to the liquid circulation pipe 51 via the optical element support frame 52 (particularly the entrance side support frame 52A). Further, since the lower end section CrD1 is also coupled to the liquid circulation pipe 51 via the optical element support frame 52 in a manner of enabling heat transfer, the heat is also transferred from the lower end section CrD2 to the liquid circulation pipe 51. Therefore, in the entrance side dust-proof glass Cr1, the upper end section CrU1 side is hard to be cooled.

Therefore, the position showing the highest temperature in the entrance side dust-proof glass Cr1 is not the position corresponding to the central portion (the position indicated by the dot line in FIG. 15A) of the light transmitting area where the temperature becomes the highest when forming an image in the liquid crystal panel 341, but the position shifted toward the upper end section CrU1 from the central portion.

The heat of the exit side dust-proof glass Cr2 is cooled by the cooling air fed from the cooling device 10. In this case, in the exit side dust-proof glass Cr2, it is set that the thermal conductivity in a direction parallel to the optical axis OAx is higher than the thermal conductivity in a direction orthogonal to the optical axis OAx, and the optical axis OAx is parallel to the longitudinal direction of the exit side dust-proof glass Cr2 as described above. Therefore, the heat of the exit side dust-proof glass Cr2 is apt to be conducted along the longitudinal direction.

Further, in the present embodiment, the cooling air from the cooling device 10 flows along a direction orthogonal to the optical axis OAx from the upper end section CrU2 where the liquid circulation pipe 51 is not located toward the lower end section CrD2 where the liquid circulation pipe 51 is located. Therefore, as described above, in the exit side dust-proof glass Cr2, the lower end section CrD2 side is hard to be cooled.

Therefore, the position showing the highest temperature in the exit side dust-proof glass Cr2 is not the position corresponding to the central portion (the position indicated by the dot line in FIG. 15B) of the light transmitting area of the liquid crystal panel 341, but the position shifted toward the lower end section CrD2 from the central portion.

In the liquid crystal panel 341 having these dust-proof glasses Cr1, Cr2, the shifting directions of the positions showing the highest temperature in the entrance side dust-proof glass Cr1 and the exit side dust-proof glass Cr2 are opposite to each other. Therefore, the position showing the highest temperature in the liquid crystal panel 341 becomes the central portion of the light beam transmitting area in the liquid crystal panel 341 as shown in FIG. 15C, and the heat in the central portion is conducted by the respective dust-proof glasses Cr1, Cr2, and therefore, the liquid crystal panel 341 is cooled efficiently as described above. Thus, it becomes possible to suppress the shift of the position showing the highest temperature in the light beam transmitting area (the image forming area), and therefore, to prevent the temperature variation (the in-plane temperature difference) in the light beam transmitting area from occurring.

According to the present embodiment described above, the following advantages are obtained.

It should be noted that for the sake of convenience of explanation, hereinafter, the portions of the liquid circulation pipe 51 disposed along the side end sections CrL1, CrR1 of the entrance side dust-proof glass Cr1 are denoted as opposed portions 51L, 51R, and the portion disposed along the lower end section CrD1 is denoted as an adjacent portion 51D (see FIG. 7).

In the present embodiment, the entrance side dust-proof glass Cr1 is made of quartz crystal. Further, the liquid circulation pipe 51 is coupled to the entrance side dust-proof glass Cr1 in a manner of enabling heat transfer so that the flow directions R1, R2 (FIG. 7) of the cooling liquid flowing through the respective opposed portions 51L, 51R are orthogonal to the optical axis OAx. According to this configuration, it is possible to transfer the heat generated in the central portion of the liquid crystal panel 341 to the respective opposed portions 51L, 51R (the cooling liquid flowing inside) of the liquid circulation pipe 51 along the optical axis OAx in which the entrance side dust-proof glass Cr1 has relatively high thermal conductivity, to thereby efficiently perform the heat radiation.

Therefore, it is possible to reduce the in-plane temperature difference between the central portion and the peripheral portion of the liquid crystal panel 341 to thereby efficiently cool the liquid crystal panel 341.

Further, the entrance side dust-proof glass Cr1 has the light beam entrance side end face having a surface contact with the bottom portion of the second recess 521B of the optical element support frame 52. According to this configuration, it is possible to assure a large contact area between the entrance side dust-proof glass Cr1 and the optical element support frame 52. Therefore, it is possible to preferably transfer the heat generated in the liquid crystal panel 341 from the entrance side dust-proof glass Cr1 to the optical element support frame 52 (the liquid circulation pipe 51) to thereby further efficiently cool the liquid crystal panel 341.

Further, the liquid circulation pipe 51 is formed to have a curved shape so as to have the opposed portions 51L, 51R and the adjacent portion 51D. According to this configuration, it is possible to couple the opposed portions 51L, 51R and the adjacent portion 51D of the liquid circulation pipe 51 to the side of the side end sections CrL1, CrR1, CrD1 respectively in a manner of enabling heat transfer. Therefore, it is possible to transfer the heat generated in the central portion of the liquid crystal panel 341 to the opposed portions 51L, 51R and the adjacent portion 51D of the liquid circulation pipe 51, respectively, via the entrance side dust-proof glass Cr1, and thus the in-plane temperature difference between the central portion and the peripheral portion of the liquid crystal panel 341 can further be reduced.

Further, the entrance side dust-proof glass Cr1 is formed so that the dimension A is larger than the dimension B, and the optical axis OAx is orthogonal to the side end sections CrL1, CrR1, namely the optical axis OAx is aligned with the side end sections CrL1, CrR1.

According to this configuration, it is possible to transfer the heat generated in the central portion of the liquid crystal panel 341 mainly to the opposed portions 51L, 51R having total liquid volume of the cooling liquid larger than that of the adjacent portion 51D along the optical axis OAx in the entrance side dust-proof glass Cr1 to thereby efficiently perform the heat radiation.

Further, the entrance side dust-proof glass Cr1 is formed to have the optical axis OAx, along which the relatively large thermal conductivity is obtained, aligned with the longitudinal direction. According to this configuration, it becomes possible to reduce the thermal resistance in the longitudinal direction in the entrance side dust-proof glass Cr1. Therefore, it is possible to preferably transfer the heat generated in the central portion of the liquid crystal panel 341 to the liquid circulation pipe 51 along the short side direction and the longitudinal direction in the entrance side dust-proof glass Cr1 to thereby efficiently perform the heat radiation.

According to the fact described above, it is possible to effectively cool the central portion of the liquid crystal panel 341 to thereby further reduce the in-plane temperature difference between the central portion and the peripheral portion of the liquid crystal panel 341.

In the exit side dust-proof glass Cr2, the thermal conductivity in a direction along the optical axis OAx is higher than the thermal conductivity in a direction orthogonal to the optical axis OAx. By setting the optical axis OAx to be parallel to the longitudinal direction, the area for holding the heat of the central portion apt to be heated to a high temperature in the exit side dust-proof glass Cr2 can be enlarged compared to the case in which the optical axis OAx is set to be parallel to the short side direction, and therefore, the heat can be diffused in the plane. Therefore, it is possible to reduce the in-plane temperature difference of the exit side dust-proof glass Cr2, and therefore, to reduce the in-plane temperature difference of the liquid crystal panel 341. Further, according to this advantage, in addition to achieving the longer life of the liquid crystal panel 341, it is possible to prevent the deterioration (e.g., a brightness variation and a color variation) in images due to a partial variation of the VT (applied voltage-light transmission) characteristic corresponding to the in-plane temperature difference.

The optical axis OAx of the exit side dust-proof glass Cr2 is set to be parallel to the longitudinal direction of the exit side dust-proof glass Cr2, and the flow direction of the cooling air is set to be orthogonal to the optical axis OAx. According to this configuration, since the channel of the cooling air flowing along the exit side dust-proof glass Cr2 becomes shorter compared to the case in which the flow direction of the cooling air is set to be parallel to the short side, the temperature in the vicinity of the right side end section CrR2 and the temperature in the vicinity of the left side end section CrL2 become substantially the same, and moreover, the temperature difference between the vicinity of the upper end section CrU2 and the vicinity of the lower end section CrD2 can be made smaller. Therefore, the in-plane temperature difference of the exit side dust-proof glass Cr2 can further be made smaller.

Similarly, as described above, the optical axis OAx of the entrance side dust-proof glass Cr1 is set to be parallel to the longitudinal direction of the entrance side dust-proof glass Cr1, and the flow direction of the cooling air flowing along the entrance side dust-proof glass Cr1 is set to be parallel to the short side direction orthogonal to the optical axis OAx. Thus, similarly to the case of the exit side dust-proof glass Cr2, the in-plane temperature difference of the entrance side dust-proof glass Cr1 can be made smaller. Further, since the flow direction front side (the lower end section CrD2 side) with a weak cooling effect by the cooling air in the entrance side dust-proof glass Cr1 is coupled to the liquid circulation pipe 51 via the optical element support frame 52 in a manner of enabling heat transfer, the in-plane temperature difference of the entrance side dust-proof glass Cr1 can further be made smaller.

Since the flow direction front side of the cooling air is provided with the liquid circulation pipe 51 coupled to the entrance side dust-proof glass Cr1 via the optical element support frame 52 in a manner of enabling heat transfer, the temperature of the flow direction front side of the cooling air becomes lower than the temperature of the flow direction base end side in the entrance side dust-proof glass Cr1. Therefore, in the entrance side dust-proof glass Cr1 disposed on the outer face of the opposed substrate 341D of the liquid crystal panel 341, the region showing the highest temperature becomes the flow direction base end side of the cooling air, and further, in the exit side dust-proof glass Cr2 disposed on the outer face of the drive substrate 341C, the region showing the highest temperature becomes the flow direction front side of the cooling air. Thus, since it is possible to efficiently cool the flow direction front side and the base end side in the liquid crystal panel 341, the in-plane temperature difference of the liquid crystal panel 341 can further be reduced.

The temperature in the exit side dust-proof glass Cr2 is apt to be lowered in the periphery while the light beam is input. Therefore, by setting the flow rate value of the cooling air flowing through the end portions in the longitudinal direction in the exit side dust-proof glass Cr2 to be lower than the flow rate value of the cooling air flowing through the central portion in the longitudinal direction, the in-plane temperature difference of the exit side dust-proof glass Cr2 can further be reduced. Further, the central portion of the exit side dust-proof glass Cr2 can be cooled efficiently using the cooling air at a constant flow rate. It should be noted that the same is applied to the entrance side dust-proof glass Cr1.

The flow rate value of the cooling air flowing along the exit side dust-proof glass Cr2 at a position on the upper end section CrU2 along the optical axis OAx is reduced as the position is shifted from the center toward the ends in the manner in which the flow rate value has a linear relationship (a proportional relationship) with the distance value from the center to the position. According to this configuration, the central portion having the highest temperature can reliably be cooled with the cooling air having a high flow rate value. Therefore, the in-plane temperature difference of the exit side dust-proof glass Cr2 can further be reduced. It should be noted that the same is also applied to the entrance side dust-proof glass Cr1.

Further, the optical element holding member 5 is provided with the liquid circulation pipe 51 and the optical element support frame 52 composed of two parts, namely the support frames 52A, 52B. Further, these members 51, 52A, and 52B are bonded by soldering with a material (e.g., the materials A through C shown in Table 1) having a melting point equal to or lower than 200° C.

According to this configuration, the temperature when bonding the support frames 52A, 52B and the liquid circulation pipe 51 can be set to be equal to or lower than 200° C., thus it is possible to reduce the residual stress caused in the support frames 52A, 52B and the liquid circulation pipe 51. Therefore, even in the case in which the liquid crystal panel 341 is made to be supported by the support frames 52A, 52B bonded to each other as described above, since the residual stress is thus reduced, deformation of the liquid crystal panel 341 due to the support frames 52A, 52B can be prevented, thus the image quality of the projection image can be maintained in a preferable state.

Further, the dividing position of the support frames 52A, 52B is set to be a position with a distance from the bottom portion of the second recess 521B, the distance corresponding to a total thickness of the opposed substrate 341D and the entrance side dust-proof glass Cr1.

According to this configuration, even in the case of bonding the support frames 52A, 52B as described above, it is prevented that the soldering material runs off from the bonded portion (e.g., the respective recesses 522A, 522B) to be attached to the bottom portion of the second recess 521B. In other words, it is possible to make the light beam entrance side end face of the entrance side dust-proof grass Cr1 have a reliable surface contact with the bottom portion of the second recess 521B. Therefore, it is possible to preferably achieve the advantage that the heat generated in the liquid crystal panel 341 can preferably be transferred from the entrance side dust-proof glass Cr1 to the optical element support frame 52 (the liquid circulation pipe 51) to thereby further efficiently cool the liquid crystal panel 341.

Modifications of Embodiment

It should be noted that the invention is not limited to the embodiment described above but includes modifications and improvements within a range where the advantages of the invention can be achieved.

Although in the embodiment the entrance side dust-proof glass Cr1 and the exit side dust-proof glass Cr2 are made of quartz crystal, the invention is not limited thereto, and it is also possible to adopt another optical crystal material having thermal conductivity in a direction parallel to the optical axis higher than thermal conductivity in a direction orthogonal to the optical axis. Further, although it is assumed that each of the entrance side dust-proof glass Cr1 and the exit side dust-proof glass Cr2 is formed to have a rectangular shape, the invention is not limited thereto, and it is also possible to adopt a circular shape or another polygonal shape. Further, it also possible for each of these dust-proof glasses to have an elliptical shape in which the longitudinal direction and the short side direction can be defined.

In the embodiment described above, it is also possible for the liquid circulation pipe 51 to have a configuration of being disposed along at least a part of the side end section in the entrance side dust-proof glass Cr1 coupled to the liquid circulation pipe 51 in a manner of enabling heat transfer, and it is also possible to adopt, for example, a configuration of disposing the liquid circulation pipe 51 along either one of the side end sections CrL1, CrR1, and CrD1, or a configuration of disposing the liquid circulation pipe 51 along any two of the side end sections CrL1, CrR1, and CrD1. Further, it is also possible to adopt the configuration in which the liquid circulation pipe 51 is disposed along the upper end section of the dust-proof glass.

It is also possible in the embodiment described above to adopt the configuration in which the optical element support frame 52 and the holding plate 5T are eliminated, and the liquid crystal panel 341 is held with the liquid circulation pipe 51.

In the embodiment described above, the direction with which the optical axis OAx in the entrance side dust-proof glass Cr1 and the exit side dust-proof glass Cr2 is aligned is not limited to the direction explained in the embodiment described above. For example, in the case in which the entrance side dust-proof glass Cr1 and the exit side dust-proof glass Cr2 are formed inversely to the case of the embodiment so that the dimension B becomes larger than the dimension A, it is preferable to form them so that the optical axis OAx is aligned with the short side direction of the entrance side dust-proof glass Cr1.

Although in the embodiment described above the heat is released from the entrance side dust-proof glass Cr1 to the optical element support frame 52, the invention is not limited thereto, and it is also possible to adopt the configuration of releasing the heat from the exit side dust-proof glass Cr2 to the optical element support frame 52. Further, it is also possible to adopt the configuration of releasing the heat from each of the entrance side dust-proof glass Cr1 and the exit side dust-proof glass Cr2 to the optical element support frame 52.

Although in the embodiment described above it is assumed that the cooling device 10 for feeding the cooling air to the optical device 34 is disposed above the optical device 34, the invention is not limited thereto. Specifically, providing that the cooling air can be fed to the entrance side dust-proof glass Cr1 and the exit side dust-proof glass Cr2 along a direction orthogonal to the optical axis OAx of either one of the dust-proof glasses Cr1, Cr2, the location and the configuration of the cooling device do not matter. Further, the cooling device 10 is not necessarily required to feed the cooling air along the direction orthogonal to the optical axis OAx, and is allowed to have the configuration of feeding the cooling air only to the dust-proof glass (e.g., the exit side dust-proof glass Cr2 not coupled to the liquid circulation pipe 51 in a manner of enabling heat transfer) at higher temperature out of the entrance side dust-proof glass Cr1 and the exit side dust-proof glass Cr2. Further, the cooling device 10 can be eliminated if the dust-proof glasses Cr1, Cr2 can be cooled sufficiently with the liquid-cooling device 4 alone.

Although in the embodiment described above it is assumed that the cooling device 10 feeds the cooling air in the manner in which the flow rate value at the center of each of the dust-proof glasses Cr1, Cr2 in a direction along the optical axis OAx becomes the highest and the flow rate value at the ends thereof in this direction becomes the lowest, the invention is not limited thereto. In other words, it is also possible for the cooling device to have a configuration of feeding the cooling air so that the flow rate value is the same in the entire area of the side end section of the dust-proof glass on the upstream side of the channel of the cooling air.

In the embodiment described above, the disposing order of the members 5 through 8 constituting the liquid-cooling device 4 is not limited to the order explained in the embodiment described above, but the members can be disposed in another order.

Although in the embodiment the three liquid crystal panels 341 are provided, the number of liquid crystal panels is not limited to three, but can be one, two, or more than three.

Although in the embodiment it is assumed that the projector 1 is provided with a pair of light source devices 31A, 31B, the invention is not limited thereto, and the number of light source devices can be one or more than two. Further, the light source device can have a configuration provided with a solid state light source such as a light emitting diode (LED) besides the configuration provided with the light source lamp 311.

In the embodiment described above, it is also possible to adopt reflective liquid crystal panels as the liquid crystal panels 341 besides the transmissive liquid crystal panels.

Although in the embodiment described above, only an example of the front type projector for performing projection from the direction in which the screen is observed is cited, the invention can be applied to rear projectors for performing projection from the direction opposite to the direction in which the screen is observed.

The projector according to the invention is capable of reducing the in-plane temperature difference of the liquid crystal panel and efficiently cooling the liquid crystal panels, and therefore can be used as a projector used for presentation or a home theater.

The present application claim priority from Japanese Patent Application No. 2009-090844 filed on Apr. 3, 2009, and No. 2010-037389 filed on Feb. 23, 2010, which is hereby incorporated by reference in its entirety.

What is claimed is:

1. A projector comprising:
a liquid crystal panel having liquid crystal encapsulated between a pair of substrates;
a liquid-cooling device adapted to cool the liquid crystal panel with a cooling liquid;
a cooling device adapted to feed cooling air to the liquid crystal panel to cool the liquid crystal panel with the cooling air;
a first translucent substrate made of an optical crystal material having thermal conductivity in a direction parallel to an optical axis higher than thermal conductivity in a direction orthogonal to the optical axis disposed on an outer surface of one of the pair of substrates; and a second translucent substrate made of an optical crystal material having thermal conductivity in a direction parallel to an optical axis higher than thermal conductivity in a direction orthogonal to the optical axis disposed on an outer surface of the other of the pair of substrates, the liquid-cooling device includes a liquid circulation pipe having a pipe shape through the cooling liquid, and disposed along at least one of side end sections of the first translucent substrate, and the liquid circulation pipe is coupled to the first translucent substrate in a manner of enabling heat transfer so that a flow direction of at least a part of the cooling liquid is orthogonal to the optical axis, wherein:

the second translucent substrate has a rectangular planar shape, the optical axis of the second translucent substrate is set to be parallel to a longitudinal direction of the second translucent substrate, and a flow direction of the cooling air fed by the cooling device and flowing along the second translucent substrate is set to be a direction orthogonal to an optical axis of the second translucent substrate.

2. The projector according to claim 1, wherein
the first translucent substrate has a rectangular planar shape, and
the liquid circulation pipe is curved so as to be disposed along three out of the four side end sections in the first translucent substrate.

3. The projector according to claim 2, wherein
denoting a dimension obtained by adding length dimensions of opposed side end sections opposed to each other out of the three side end sections as A, and a length dimension of an adjacent side end section located adjacent to the opposed side end sections as B,
the first translucent substrate has the optical axis orthogonal to each of the opposed side end sections if a relationship of A>B is satisfied, and
the first translucent substrate has the optical axis orthogonal to the adjacent side end section if a relationship of A<B is satisfied.

4. The projector according to claim 2, wherein
the first translucent substrate has the optical axis aligned with a longitudinal direction.

5. The projector according to claim 1, wherein
the second translucent substrate has a pair of side end sections disposed along a longitudinal side and a pair of side end sections disposed along a short side, and
the cooling device makes the cooling air flow toward one of the pair of side end sections disposed along the longitudinal side in the second translucent substrate on a side where the liquid circulation pipe is located from the other of the pair of side end sections on a side where the liquid circulation pipe is not located.

6. The projector according to claim 5, wherein
the cooling device makes the cooling air flow in a manner in which the flow rate value of the cooling air at a position in the side end section along the longitudinal side in the second translucent substrate is reduced as the position is shifted from a center of the side end section toward the side end section along the short side.

7. The projector according to claim 6, wherein
the cooling device feeds the cooling air so that the flow rate value of the cooling air at the position and a distance value from the center of the side end section along the longitudinal side to the position have a linear relationship.

8. The projector according to claim 1, wherein
the liquid-cooling device has an optical element support frame adapted to support the liquid crystal panel, and to couple the first translucent substrate and the liquid circulation pipe to each other in a manner of enabling heat transfer,
the optical element support frame has a first support frame and a second support frame provided separately from each other around a plane substantially parallel to the flow direction of the cooling liquid in the liquid circulation pipe, and adapted to sandwich the liquid circulation pipe,
the first and second support frames and the liquid circulation pipe are each made of a metal material and are bonded to each other by soldering, and
a material for the soldering is made of a material having a melting point equal to or lower than 200° C.

* * * * *